(12) United States Patent
Shifren et al.

(10) Patent No.: US 10,937,831 B2
(45) Date of Patent: *Mar. 2, 2021

(54) CORRELATED ELECTRON SWITCH STRUCTURES AND APPLICATIONS

(71) Applicant: Arm Limited, Cambridge (GB)

(72) Inventors: Lucian Shifren, San Jose, CA (US); Kimberly Gay Reid, Austin, TX (US); Gregory Munson Yeric, Austin, TX (US)

(73) Assignee: CERFE LABS, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/600,372

(22) Filed: Oct. 11, 2019

(65) Prior Publication Data
US 2020/0043982 A1 Feb. 6, 2020

Related U.S. Application Data

(63) Continuation of application No. 15/984,223, filed on May 18, 2018, now Pat. No. 10,446,609, which is a continuation of application No. 15/270,974, filed on Sep. 20, 2016, now Pat. No. 9,978,942.

(51) Int. Cl.
*H01L 27/24* (2006.01)
*H01L 45/00* (2006.01)

(52) U.S. Cl.
CPC .......... *H01L 27/2436* (2013.01); *H01L 45/04* (2013.01); *H01L 45/1226* (2013.01); *H01L 45/1233* (2013.01); *H01L 45/146* (2013.01)

(58) Field of Classification Search
CPC . H01L 27/2436; H01L 45/04; H01L 45/1226; H01L 45/1233; H01L 45/146; H01L 49/003; H01L 49/006

USPC .......................................................... 257/43
See application file for complete search history.

(56) References Cited

U.S. PATENT DOCUMENTS

| | | | |
|---|---|---|---|
| 7,598,640 B2 | 10/2009 | Heichel et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 8,445,881 B2 * | 5/2013 | Awaya | H01L 45/08 257/2 |
| 9,514,814 B1 | 12/2016 | Sandhu et al. | |
| 9,548,118 B1 | 1/2017 | Bhavnagarwala et al. | |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 9,621,161 B1 | 4/2017 | Das et al. | |
| 9,660,189 B1 | 5/2017 | Reid et al. | |
| 9,734,895 B2 | 8/2017 | Savanth et al. | |
| 9,735,360 B2 | 8/2017 | Shifren et al. | |

(Continued)

FOREIGN PATENT DOCUMENTS

JP 2011238828 A 11/2011

OTHER PUBLICATIONS

Invitation to Pay Additional Fees and, Where Applicable, Protest Fee, dated Dec. 20, 2017, App. No. PCT/GB2017/052770, 13 Pages.

(Continued)

*Primary Examiner* — Tu-Tu V Ho
(74) *Attorney, Agent, or Firm* — Berkeley Law & Technology Group, LLP

(57) ABSTRACT

Subject matter disclosed herein may relate to devices formed from correlated electron material.

20 Claims, 15 Drawing Sheets

(56) References Cited

U.S. PATENT DOCUMENTS

| | | |
|---|---|---|
| 9,735,766 B2 | 8/2017 | Shifren |
| 9,747,982 B1 | 8/2017 | Shifren et al. |
| 9,748,943 B2 | 8/2017 | Sandhu et al. |
| 9,755,146 B2 | 9/2017 | Shifren et al. |
| 9,773,550 B2 | 9/2017 | Bhavnagarwala et al. |
| 9,786,370 B2 | 10/2017 | Aitken et al. |
| 9,792,982 B1 | 10/2017 | Sandhu |
| 9,792,984 B1 | 10/2017 | Bhavnagarwala et al. |
| 9,805,777 B2 | 10/2017 | Sandhu et al. |
| 9,851,738 B2 | 12/2017 | Sandhu et al. |
| 9,871,528 B1 | 1/2018 | Kumar et al. |
| 9,899,083 B1 | 2/2018 | Rosendale |
| 9,947,402 B1 | 4/2018 | Bhavnagarwala et al. |
| 9,972,388 B2 | 5/2018 | Das et al. |
| 9,978,942 B2 | 5/2018 | Shifren et al. |
| 9,979,385 B2 | 5/2018 | Sandhu et al. |
| 9,990,992 B2 | 6/2018 | Bhavnagarwala et al. |
| 9,997,424 B2 | 6/2018 | Arvin et al. |
| 10,002,665 B1 | 6/2018 | Bhargava et al. |
| 10,002,669 B1 | 6/2018 | Bhargava et al. |
| 10,032,487 B2 | 7/2018 | Shifren et al. |
| 2006/0170027 A1 | 8/2006 | Lee et al. |
| 2008/0106926 A1 | 5/2008 | Brubaker |
| 2008/0107801 A1 | 5/2008 | Celjnska et al. |
| 2013/0200323 A1 | 8/2013 | Pham et al. |
| 2013/0207069 A1 | 8/2013 | Pickett et al. |
| 2013/0214232 A1 | 8/2013 | Tendulkar et al. |
| 2013/0285699 A1 | 10/2013 | McWilliams et al. |
| 2016/0163978 A1 | 6/2016 | Paz De Araujo et al. |
| 2017/0033782 A1 | 2/2017 | Shifren et al. |
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |
| 2017/0092858 A1 | 3/2017 | Shifren |
| 2017/0147207 A1 | 5/2017 | Hansson et al. |
| 2017/0244027 A1 | 8/2017 | Reid et al. |
| 2017/0244032 A1 | 8/2017 | Reid et al. |
| 2017/0288675 A1 | 10/2017 | Chandra et al. |
| 2018/0095114 A1 | 4/2018 | Bhargave et al. |

OTHER PUBLICATIONS

Notification of Transmittal of the International Search Report and the Written Opinion of the International Searching Authority, or the Declaration, dated Feb. 13, 2018, App. No. PCT/GB2017/052770, 1 Page.
International Search Report, dated Feb. 13, 2018, App. No. PCT/GB2017/052770, 8 Pages.
Written Opinion of the International Searching Authority, dated Feb. 13, 2018, App. No. PCT/GB2017/052770, 12 Pages.
Application as Filed, U.S. Appl. No. 15/270,074, filed Sep. 20, 2016, 93 Pages.
Restriction Requirement, dated Mar. 23, 2017, U.S. Appl. No. 15/270,974, 5 Pages.
Response to Restriction Requirment, Filed May 23, 2017, U.S. Appl. No. 15/270,974, 7 Pages.
Office Action, dated Aug. 16, 2017, U.S. Appl. No. 15/270,974, 16 Pages.
Response to Office Action, Filed Nov. 14, 2017, U.S. Appl. No. 15/270,974, 12 Pages.
Notice of Allowance, dated Jan. 19, 2018, U.S. Appl. No. 15/270,974, 7 Pages.
Issue Fee Payment, Filed Apr. 18, 2018, U.S. Appl. No. 15/270,974, 11 Pages.
Issue Notification, U.S. Appl. No. 15/270,974, filed Sep. 20, 2016, dated May 2, 2018, 1 Page.
Application as Filed, U.S. Appl. No. 15/984,223, filed May 18, 2018, 106 Pages.
Office Action, U.S. Appl. No. 15/984,223, dated Dec. 21, 2018, 24 Pages.
Response to Office Action, U.S. Appl. No. 15/984,223, filed Mar. 21, 2019, 10 Pages.
Notice of Allowance, U.S. Appl. No. 15/984,223, dated May 17, 2019, 9 Pages.
Issue Fee as Filed, U.S. Appl. No. 15/984,223, filed Aug. 19, 2019, 10 Pages.
Issue Notifiation, U.S. Appl. No. 15/984,223, dated Sep. 25, 2019, 1 Page.
Communication pursuant to Rules 161(1) and 162 EPC, App. No. EP17772455.6, dated Apr. 29, 2019, 3 Pages.
Response to Rules 161(1) and 162 EPC, App. No. EP17772455.6, Filed Oct. 24, 2019, 11 Pages.
Acknowledgement of Receipt for Responses to Rules 161(1) and 162 EPC, App. No. EP17772455.6, dated Oct. 24, 2019, 1 Page.

* cited by examiner

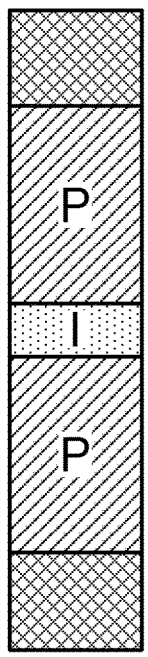 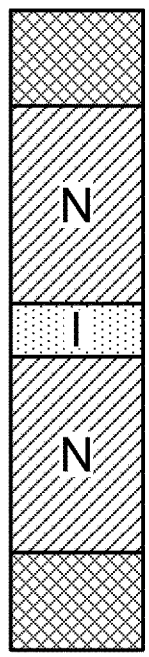 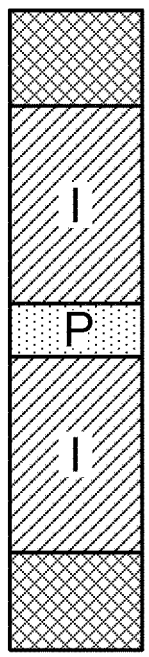 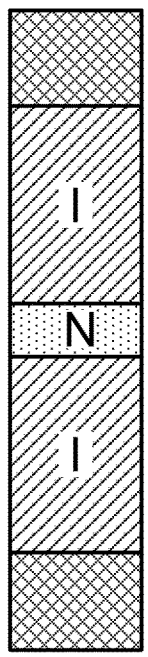
*FIG. 10A*  *FIG. 10B*  *FIG. 10C*  *FIG. 10D*

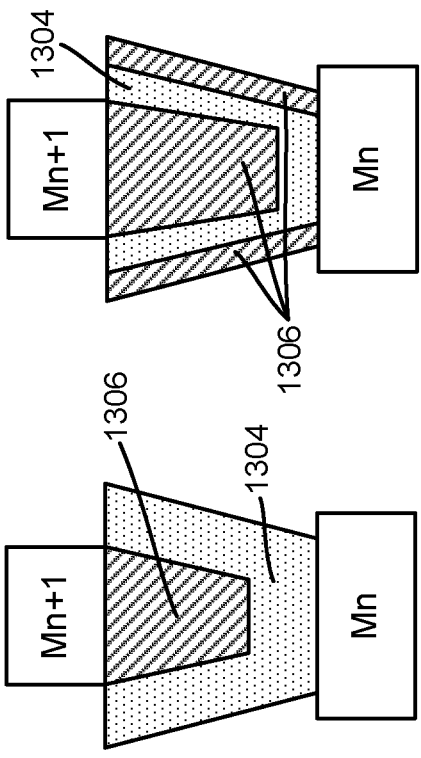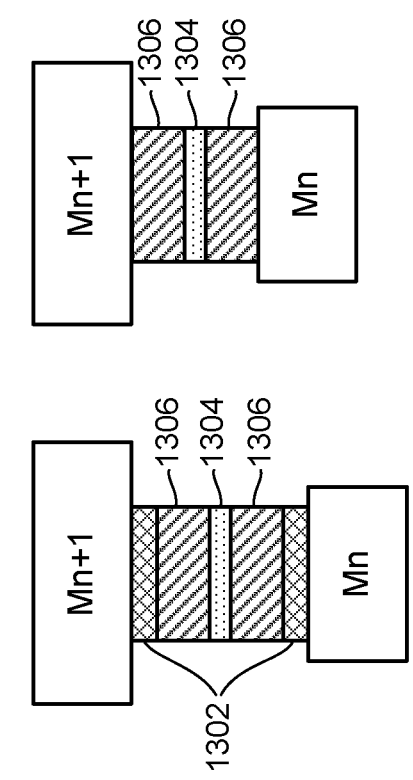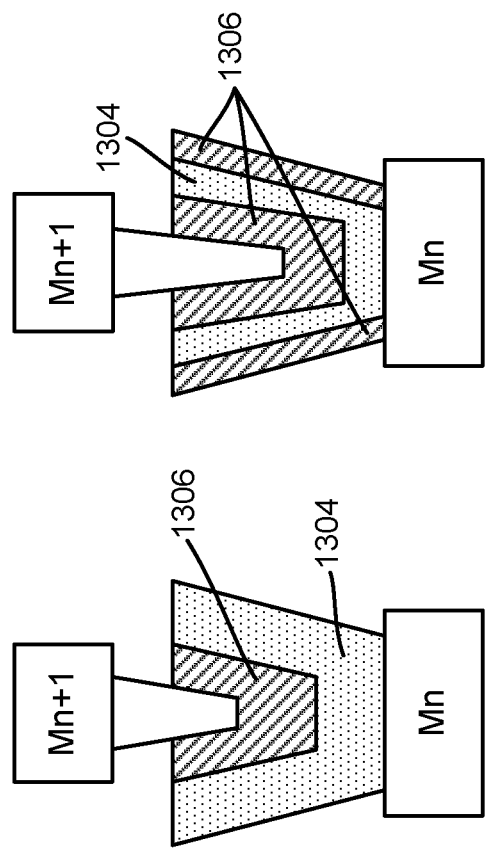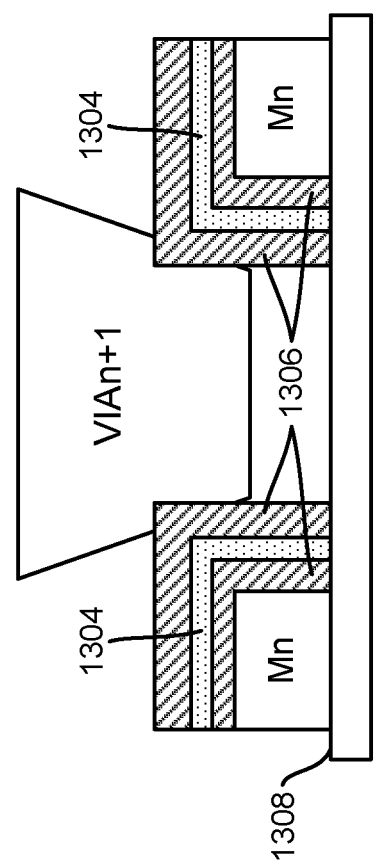
FIG. 13A  FIG. 13B  FIG. 13C  FIG. 13D  FIG. 13E  FIG. 13F  FIG. 13G

CORRELATED ELECTRON SWITCH STRUCTURES AND APPLICATIONS

CROSS-REFERENCE TO RELATED APPLICATIONS

This application is a divisional of U.S. patent application Ser. No. 15/984,223, titled CORRELATED ELECTRON SWITCH STRUCTURES AND APPLICATIONS, filed on May 18, 2018 and issued as U.S. Pat. No. 10,446,609, which is a continuation of U.S. patent application Ser. No. 15/270, 974, titled CORRELATED ELECTRON SWITCH STRUCTURES AND APPLICATIONS, filed Sep. 20, 2016 and issued as U.S. Pat. No. 9,978,942.

BACKGROUND

Field

Subject matter disclosed herein may relate to correlated electron switch devices including applications of correlated electron switch devices.

Information

Integrated circuit devices, such as electronic switching devices, for example, may be found in a wide range of electronic device types. For example, memory and/or logic devices may incorporate electronic switches that may be used in computers, digital cameras, cellular telephones, tablet devices, personal digital assistants, etc. Factors related to electronic switching devices, such as may be incorporated in memory and/or logic devices, that may be of interest to a designer in considering suitability for any particular application may include physical size, storage density, operating voltages, and/or power consumption, for example. Other example factors that may be of interest to designers may include cost of manufacture, ease of manufacture, scalability, and/or reliability. Also, there appears to be an ever increasing need for memory and/or logic devices that exhibit characteristics of lower power and/or higher speed.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIGS. 10A through 10D shows structures of devices formed from CEM according to an embodiment.

FIGS. 13A through 13G are diagrams depicting structures formed from deposition of CEM according to particular embodiments.

Figure 1A:
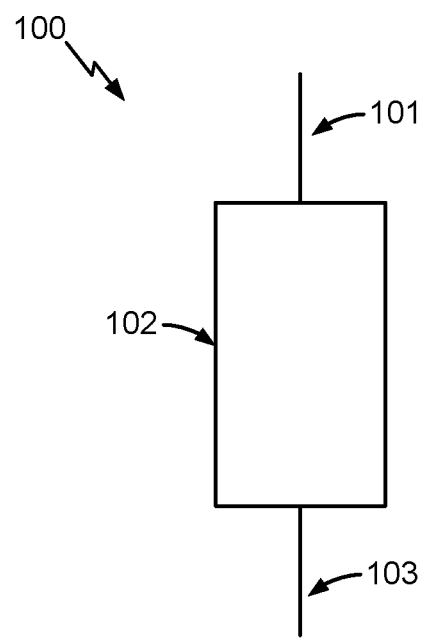
FIG. 1a shows block diagram of an example embodiment of a correlated electron switch device comprising a correlated electron material, in accordance with an embodiment.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from claimed subject matter. It should also be noted that directions and/or references, for example, such as up, down, top, bottom, and so on, may be used to facilitate discussion of drawings and/or are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

As utilized herein, the terms "coupled", "connected," and/or similar terms are used generically. It should be understood that these terms are not intended as synonyms. Rather, "connected" is used generically to indicate that two or more components, for example, are in direct physical, including electrical, contact; while, "coupled" is used generically to mean that two or more components are potentially in direct physical, including electrical, contact; however, "coupled" is also used generically to also mean that two or more components are not necessarily in direct contact, but nonetheless are able to co-operate and/or interact. The term coupled is also understood generically to mean indirectly connected, for example, in an appropriate context.

The terms, "and", "or", "and/or" and/or similar terms, as used herein, include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

Particular aspects of the present disclosure incorporate correlated electron material (CEM) to form a correlated electron switch (CES), such as, for example, in memory and/or logic devices. CES devices may also be utilized in a wide range of other electronic circuit types, such as, for example, filter circuits, data converters, phase locked loop circuits, and high-speed transceivers, although the scope of claimed subject matter is not limited in scope in these respects. In this context, a CES may exhibit a substantially abrupt conductor/insulator transition arising from electron correlations rather than solid state structural phase changes (e.g., crystalline/amorphous in phase change memory (PCM) devices or filamentary formation and conduction in resistive RAM devices). In one aspect, a substantially abrupt conductor/insulator transition in a CES may be responsive to a quantum mechanical phenomenon, in contrast to melting/solidification or filament formation, for example. Such a quantum mechanical transition between conductive and insulative states, and/or between first and second impedance states, in a CES may be understood in any one of several aspects. As used herein, the terms "conductive state", "lower impedance state", and/or "metal state" may be interchangeable, and/or may at times be referred to as a "conductive/lower impedance state." Similarly, the terms "insulative state" and "higher impedance state" may be used interchangeably herein, and/or may at times be referred to as an "insulative/higher impedance state."

In an aspect, a quantum mechanical transition of correlated electron switch material between an insulative/higher impedance state and a conductive/lower impedance state may be understood in terms of a Mott transition. In a Mott transition, a material may switch from an insulative/higher impedance state to a conductive/lower impedance state if a Mott transition condition occurs. The Mott criteria is defined by $(n_c)1^{1/3}a \approx 0.26$, where $n_c$ is a concentration of electrons and "a" is the Bohr radius. When a critical carrier concentration is achieved such that the Mott criteria is met, the Mott transition will occur and the state of the CES will change from a higher resistance/higher capacitance state (that is, an insulative/higher impedance state) to a lower resistance/lower capacitance state (that is, a conductive/lower impedance state).

In another aspect, the Mott transition is controlled by a localization of electrons. When carriers are localized, the strong coulomb interaction between the electrons splits the bands of the CEM to create an insulator. When electrons are no longer localized, the weak coulomb interaction dominates and the band splitting is removed, resulting in a metal (conductive) band. This is sometimes explained as a "crowded elevator" phenomenon. While an elevator has only a few people in it, the people can move around easily, which is analogous to a conductive/lower impedance state. While the elevator reaches a certain concentration of people, on the other hand, the people can no longer move, which is analogous to the insulative/higher impedance state. However, it should be understood that this classical explanation provided for illustrative purposes, like all classical explanations of quantum phenomenon, is only an incomplete analogy, and that claimed subject matter is not limited in this respect.

Further, in an embodiment, switching from an insulative/higher impedance state to a conductive/lower impedance state may bring about a change in capacitance in addition to a change in resistance. For example, a CES may include the property of variable resistance together with the property of variable capacitance. That is, impedance characteristics of a CES device may include both resistive and capacitive components. For example, in a metal state, a CEM may have substantially zero electric field, and therefore substantially zero capacitance. Similarly, in an insulative/higher impedance state (in which electron screening may be very imperfect due to lower density of free electrons), an external electric field may be capable of penetrating the CEM and therefore the CEM will have capacitance due to a physical change in the dielectric function of the CEM. Thus, for example, a transition from an insulative/higher impedance state to a conductive/lower impedance state in a CES may result in changes in both resistance and capacitance, in an aspect.

In an embodiment, a CES device may switch impedance states responsive to a Mott-transition in a majority of the volume of the CEM of a CES device. In an embodiment, a CES device may comprise a "bulk switch." As used herein, the term "bulk switch" refers to at least a majority volume of a CEM of a CES device switching impedance states, such as responsive to a Mott-transition. For example, in an embodiment, substantially all of a CEM of a CES device may switch from an insulative/higher impedance state to a conductive/lower impedance state or from a conductive/lower impedance state to an insulative/higher impedance state responsive to a Mott-transition. In an aspect, a CEM may comprise one or more transition metal oxides, one or more rare earth oxides, one or more oxides of one or more f-block elements of the periodic table, one or more rare earth transitional metal oxide perovskites, yttrium, and/or ytterbium, although claimed subject matter is not limited in scope in this respect. In an embodiment, a device, such as CES device, may comprise CEM including one or more materials selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof, although claimed subject matter is not limited in scope in this respect.

FIG. 1 a shows an example embodiment 100 of a CES device comprising CEM, such as material 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, the CEM, such as material 102, may transition between the aforementioned conductive/lower impedance state and insulative/higher impedance state. As mentioned, CEM, such as material 102, in a variable impeder device, such as CES device 100, may transition between a first impedance state and a second impedance state due to a quantum mechanical transition of the correlated electron switch material as a result an applied critical voltage and an applied critical current, as described in more detail below. Also, as mentioned above, a variable impeder device, such as variable impeder device 100, may exhibit properties of both variable resistance and variable capacitance.

In a particular embodiment, a variable impeder device, such as CES device 100, may comprise a CEM that may transition between or among a plurality of detectable impedance states based, at least in part, on a transition of at least a majority portion of the CEM between an insulative/higher impedance state and a conductive/lower impedance state due to a quantum mechanical transition of the correlated electron switch material. For example, in an embodiment, a CES device may comprise a bulk switch, in that substantially all of a CEM of a CES device may switch from an insulative/higher impedance state to a conductive/lower impedance state or from a conductive/lower impedance state to an insulative/higher impedance state responsive to a Mott-transition. In this context, an "impedance state" means a detectable state of a variable impeder device that is indicative of a value, symbol, parameter and/or condition, just to provide a few examples. In one particular embodiment, as described below, an impedance state of a CES device may be detected based, at least in part, on a signal detected on terminals of the CES device in a read and/or sense operation. In another particular embodiment, as described below, a CES device may be placed in a particular impedance state to represent or store a particular value, symbol, and/or parameter, and/or to achieve a particular capacitance value for the CES device by application of one or more signals across terminals of the CES device in a "write" and/or "program" operation, for example. Of course, claimed subject matter is not limited in scope to the particular example embodiments described herein.

Figure 1B:
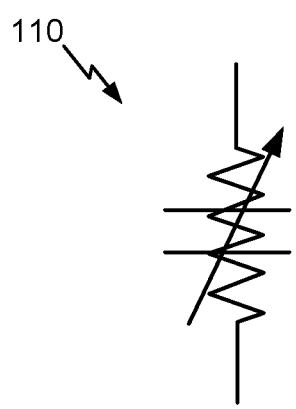
FIG. 1b depicts an example symbol for a correlated electron switch.

FIG. 1b depicts an example symbol 110 that may be utilized, for example, in electrical circuit schematic diagrams to notate a CES/variable impeder device. Example symbol 110 is meant to remind the viewer of the variable resistance and variable capacitance properties of a CES/variable impeder device, such as CES device 100. Example symbol 110 is not meant to represent an actual circuit diagram, but is merely meant as an electrical circuit diagram symbol. Of course, claimed subject matter is not limited in scope in these respects.

Figure 2:
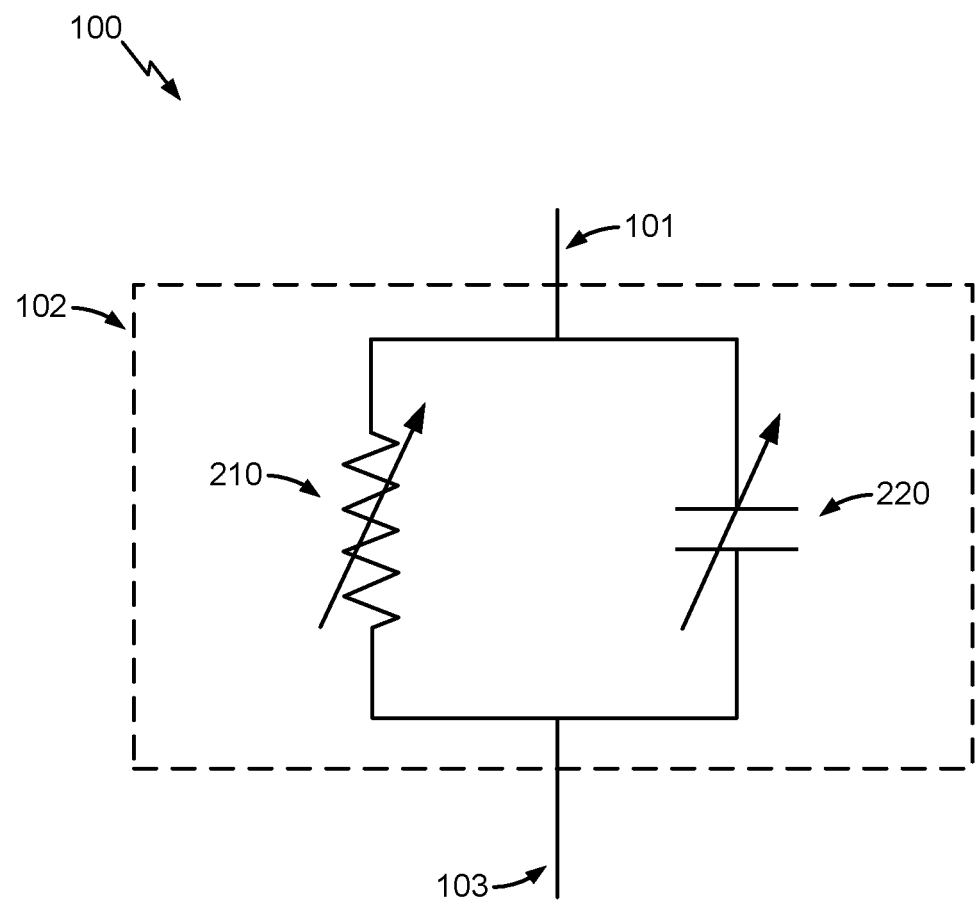
FIG. 2 is a schematic diagram of an equivalent circuit of a correlated electron switch, in accordance with an embodiment.

FIG. 2 depicts a schematic diagram of an equivalent circuit of an example CES/variable impeder device, such as CES device 100. As mentioned, a CES/variable impeder device may comprise characteristics of both variable resistance and variable capacitance. That is, the impedance characteristics for a CES/variable impeder device, such as CES device 100, may depend at least in part on the resistance and capacitance characteristics of the device. For example, an equivalent circuit for a variable impeder device may, in an embodiment, comprise a variable resistor, such as variable resistor 210 in parallel with a variable capacitor, such as variable capacitor 220. Of course, although a variable resistor 210 and variable capacitor 220 are depicted in FIG. 2 as comprising discrete components, a variable impeder device, such as CES 100, may comprise a substantially homogenous CEM, such as CEM 102, wherein the CEM comprises characteristics of variable capacitance and variable resistance.

Table 1 below depicts an example truth table for an example variable impeder device, such as CES device 100.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

In an embodiment, example truth table of Table 1 shows that a resistance of a variable impeder device, such as CES device 100, may transition between a lower resistance state and a higher resistance state that is a function, at least in part, of a voltage applied across the CEM. In an embodiment, a resistance of a lower resistance state may be 10-100,000 times lower than a resistance of a higher resistance state, although claimed subject matter is not limited in scope in this respect. Similarly, example truth table of Table 1 shows that a capacitance of a variable impeder device, such as CES device 100, may transition between a lower capacitance state, which for an example embodiment may comprise approximately zero, or very little, capacitance, and a higher capacitance state that is a function, at least in part, of a voltage applied across the CEM. Also, as seen in Table 1, a variable impeder device transition from a higher resistance/higher capacitance state to a lower resistance/lower capacitance state may be represented as a transition from a higher impedance state to a lower impedance state. Similarly, a transition from a lower resistance/lower capacitance state to a higher resistance/higher capacitance state may be represented as a transition from a lower impedance state to a higher impedance state.

It should be noted that a variable impeder, such as CES 100, is not purely a resistor, but rather comprises a device having properties of both variable capacitance and variable resistance. In an embodiment, resistance and/or capacitance values, and therefore impedance values, depend, at least in part, on an applied voltage.

Figure 3:
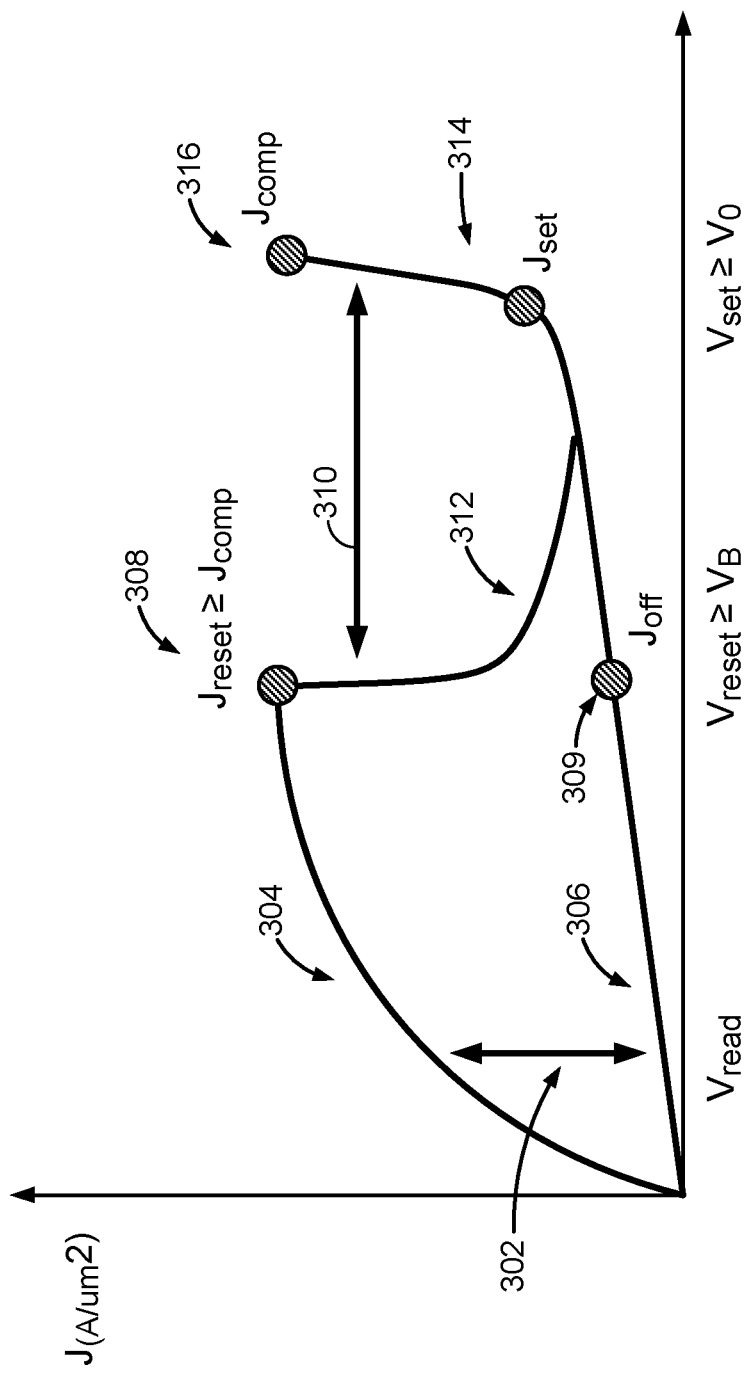
FIG. 3 shows a plot of current density versus voltage for a correlated electron switch, in according to an embodiment.

FIG. 3 shows a plot of current density versus voltage across electrically conductive terminals, such as electrically conductive terminals 101 and 103, for a CES device, such as example CES device 100, according to an embodiment.

Based, at least in part, on a voltage applied to terminals of a variable impeder device (e.g., in a write operation), such as variable impeder device 100, a CEM, such as CEM 102, may be placed in a conductive/lower impedance state or an insulative/higher impedance state. For example, application of a voltage $V_{reset}$ and current density $J_{reset}$ may place the CES device in an insulative/higher impedance state, and application of a voltage $V_{set}$ and a current density $J_{set}$ may place the CES device in a conductive/lower impedance state. That is, a "set" condition may place a variable impeder device, such as CES device 100, into a conductive/lower impedance state, and a "reset" condition may place a variable impeder device, such as CES device 100, into an insulative/higher impedance state, in an embodiment. Following placement of the CES device in a lower impedance state or a higher impedance state, the particular state of the CES device may be detected at least in part by application of a voltage $V_{read}$ (e.g., in a read operation) and detection of a current or current density at terminals, such as electrically conductive terminals 101 and 103, of a variable impeder device, such as CES device 100.

In an embodiment, a CEM of a CES device may include, for example, any TMO, such as, for example, peroskovites, Mott insulators, charge exchange insulators, and/or Anderson disorder insulators. In a particular embodiment, a CES device may be formed from CEMs such as nickel oxide, cobalt oxide, iron oxide, yttrium oxide and peroskovites such as Cr doped strontium titanate, lanthanum titanate, and the manganite family including praesydium calcium manganite, and praesydium lanthanum manganite, to provide a few examples. In an embodiment, oxides incorporating elements with incomplete d and f orbital shells may exhibit sufficient impedance switching properties to serve as CEM for use in a CES device. In an embodiment, a CES may be prepared without electroforming. Other embodiments may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from the scope of claimed subject matter.

In one aspect, the CES device of FIG. 1 may comprise CEMs that comprise TMO metal oxide variable impedance materials, though it should be understood that these are exemplary only, and are not intended to limit the scope of claimed subject matter. Particular implementations may employ other variable impedance materials as well. Nickel oxide, NiO, is disclosed as one particular TMO. NiO materials discussed herein may be doped with extrinsic ligands, which may stabilize variable impedance properties by passivating the interfacing and allowing for adjustable voltages and impedances, in an embodiment. In a particular embodiment, NiO variable impedance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences, in an embodiment. In another particular example embodiment, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences, in an embodiment.

In an embodiment, CES devices may be initially manufactured in a conductive/lower impedance state. Also, in an embodiment, CES devices may be non-volatile, in that CES devices may maintain respective impedance states until further programming is performed. For example, according to an embodiment, if sufficient bias is applied (e.g., exceeding a band-splitting potential) and the aforementioned Mott condition is met (injected electron holes=the electrons in the switching region), the CES device may rapidly switch from a conductive/lower impedance state to an insulator state via the Mott transition. This may occur at point 308 of the plot in FIG. 3. At this point, electrons are no longer screened and become localized. This correlation splits the bands to form an insulator. While the CEM of the CES device is still in the insulative/higher impedance state, current may generated by transportation of holes. If enough bias is applied across terminals of the CES device, electrons may be injected into a metal-insulator-metal (MIM) diode over the potential barrier of the MIM device. If enough electrons have been injected and enough potential is applied across terminals to achieve a set condition, an increase in electrons may screen electrons and remove a localization of electrons, which may collapse the band-splitting potential forming a metal, thereby placing the CES device in a conductive/lower impedance state.

According to an embodiment, current in a CEM of a CES device may be controlled by an externally applied "compliance" condition determined based, at least in part, on the external current limited during a write operation to achieve a set condition to place the CES device in a conductive/lower impedance state. This externally applied compliance current also sets the subsequent reset condition current density requirement. As shown in the particular implementation of FIG. 3, a current density $J_{comp}$ applied during a write operation at point 316 to place the CES device in a conductive/lower impedance state may determine a compliance condition for placing the CES in an insulative/higher impedance state in a subsequent write operation. As shown, the CEM of the CES device may be subsequently placed in an insulative/higher impedance state by application of a current density $J_{reset} \geq J_{comp}$ at a voltage $V_{reset}$ at point 308, wherein $J_{comp}$ may be externally applied, in an embodiment.

A compliance current, such as an externally applied compliance current, therefore may set a number of electrons in a CEM of a CES device which are to be "captured" by holes for the Mott transition. In other words, a current applied in a write operation to place a CES device in a conductive/lower impedance state may determine a number of holes to be injected to the CEM of the CES device for subsequently transitioning the CES device to an insulative/higher impedance state. As discussed more fully below, a compliance current may be applied dynamically.

As pointed out above, a transition to an insulative/higher impedance state may occur in response to a Mott transition at point 308. As pointed out above, such a Mott transition may occur at a condition in a CEM of a CES device in which a concentration of electrons n equals a concentration of electron holes p. This condition occurs when the following Mott criteria is met, as represented by expression (1) as follows:

$$\lambda_{TF} n^{\frac{1}{3}} = C \sim 0.26 \qquad (1)$$

$$n = \left(\frac{C}{\lambda_{TF}}\right)^3$$

where:

$\lambda_{TF}$ is a Thomas Fermi screening length; and

C is a constant which equals approximately 0.26 for the Mott transition.

According to an embodiment, a current or current density in a region 304 of the plot shown in FIG. 3 may exist in response to an injection of holes from a voltage signal applied across terminals, such as terminals 101 and 103, of a variable impeder device, such as CES device 100. Here, injection of holes may meet a Mott transition criterion for the conductive to insulator transition at current $I_{MI}$ as a critical voltage $V_{MI}$ is applied across terminals, such as terminal 101 and 103, of a variable impeder device, such as CES device 100. This may be modeled according to expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

Where $Q(V_{MI})$ is the charge injected (hole or electron) and is a function of the applied voltage. As used herein, the notation "MI" signifies a metal-to-insulator transition, and the notation "IM" signifies an insulator-metal transition. That is, "$V_{MI}$" refers to a critical voltage and "$I_{MI}$" refers to a critical current to transition a CEM from a conductive/lower impedance state to an insulative/higher impedance state. Similarly, "$V_{IM}$" refers to a critical voltage and "$I_{IM}$" refers to a critical current to transition a CEM from an insulative/higher impedance state to a conductive/lower impedance state.

Injection of holes to enable a Mott transition may occur between bands and in response to critical voltage $V_{MI}$ and critical current $I_{MI}$. By equating electron concentration n with the needed charge concentration to result in a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

Wherein $A_{CEM}$ is a cross-sectional area of a CEM, such as CEM 102, of a variable impeder device, such as CES device 100, and wherein $J_{reset}(V_{MI})$, depicted at point 308 of example plot 300, is a current density through the CEM, such as CEM 102, to be applied to the CEM at a critical voltage $V_{MI}$ to place the CEM of the CES device in an insulative/higher impedance state. In an embodiment, a CEM may be switched between a conductive/lower impedance state and an insulative/higher impedance state at least in part by a disproportionation reaction.

According to an embodiment, a CEM, such as CEM 102, of a variable impeder device, such as CES device 100, may be placed in a conductive/lower impedance state (e.g., by transitioning from an insulative/higher impedance state) by injection of a sufficient number of electrons to satisfy a Mott transition criteria.

In transitioning a CEM of a CES device to a conductive/lower impedance state, as enough electrons have been injected and the potential across terminals of the variable impeder device overcomes a critical switching potential (e.g., $V_{set}$), injected electrons begin to screen and unlocalize double-occupied electrons to reverse a disproportion reaction and closing the bandgap. A current density $J_{set}(V_{MI})$, depicted at point 314 of FIG. 3, for transitioning the CEM of the CES device to the conductive/lower impedance state in a metal-insulator Mott transition at a critical voltage $V_{MI}$ enabling transition to the conductive/lower impedance state may be represented according to expressions (4) as follows:

$$I_{MI}(V_{MI}) = \frac{dQ(V_{MI})}{dt} \approx \frac{Q(V_{MI})}{t} \qquad (4)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{IM}) = J_{injection}(V_{IM}) = J_{IM}(V_{IM}) = \frac{I_{IM}(V_{IM})}{A_{CEM}} = \frac{q}{A_{CEM}t}\left(\frac{C}{a_B}\right)^3$$

where:

$a_B$ is a Bohr radius.

According to an embodiment, a "read window" 302 for detecting a memory state of a CES device in a read operation may be set out as a difference between a portion 306 the plot of FIG. 3 while the CEM of the CES device is in an insulative/higher impedance state and a portion 304 of the plot FIG. 3 while the CEM of the CES device is in a conductive/lower impedance state at a read voltage $V_{read}$. In a particular implementation, read window 302 may be used to determine the Thomas Fermi screening length $\lambda_{TF}$ of a CEM, such as correlated electron switch material 102, of a variable impeder device, such as CES device 100. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \qquad (5)$$

wherein $J_{off}$ represents a current density of a CEM in an insulative/higher impedance state at $V_{reset}$. See, for example, point 309 of FIG. 3.

In another embodiment, a "write window" 310 for placing a CEM of CES device in an insulative/higher impedance or conductive/lower impedance state in a write operation may be set out as a difference between $V_{reset}$ and $V_{set}$. Establishing $|V_{set}|>|V_{reset}|$ may enable a switch between the conductive/lower impedance and insulative/higher impedance state. $V_{reset}$ may comprise approximately the band splitting potential caused by the correlation and $V_{set}$ may comprise approximately twice the band splitting potential, such that the read window may comprise approximately the band-splitting potential. In particular implementations, a size of write window 310 may be determined, at least in part, by materials and doping of the CEM of the CES device.

In an embodiment, a process for reading a value represented as an impedance state of a variable impeder device, such as CES device 100, may comprise a voltage being applied to a CEM of a CES device. At least one of a current and/or current density within a CEM of a CES device may be measured, and an impedance state of a CEM of a CES device may be determined, at least in part, on the measured current and/or current density, in an embodiment.

Additionally, in an embodiment, an impedance of an impedance state may depend at least in part on a combination of a capacitance and a resistance of a CEM of a CES device. In an embodiment, the determined impedance state may comprise one of a plurality of impedance states. A first impedance state may comprise a lower resistance and lower capacitance, and a second impedance state may comprise a higher resistance and a higher capacitance, for example. Also, in an embodiment, a ratio of the impedances of the plurality of impedance states may be proportional to a physical property of the CEM of the CES device. In an embodiment, the physical property of the CEM of the CES device may comprise at least one of a Thomas Fermi screening length and a Bohr radius. Further, in an embodiment, individual impedance states of the plurality of impedance states may be associated with a data value. Additionally, in an embodiment, a difference in current between a first impedance state and a second impedance state at a predetermined voltage provides an indication of a read window. However, claimed subject matter is not limited in scope in these respects.

In an embodiment, a plurality of electrons may be provided to a CEM of a CES device such that the CES enters a first impedance state. A plurality of holes may be provided to the CEM such that the CES enters a second impedance state. Also, in an embodiment, the plurality of electrons may cause a voltage across the CES to be greater than a set voltage threshold, and the plurality of holes may cause the voltage across the CES to be equal to or greater than a reset voltage threshold. Further, in an embodiment, a voltage across the CEM may cause a current density in the CEM to be equal to or greater than a set current density and/or a set current, and a voltage across the CEM may cause a current density in the CEM to be equal to or greater than a reset current density and/or a reset current.

Also, in an embodiment, a set voltage across the CEM and a set current density through a CEM of a CES device may be exceeded. Additionally, a reset voltage across a CEM and a reset current density through a CEM of a CES device may be exceeded. Further, in an embodiment, individual impedance states of a plurality of impedance states may be associated with a data value.

In an embodiment, at least one of a reset voltage, a set voltage, and a difference between the set voltage and the reset voltage are proportional to a physical property of a CEM of a CES device. A physical property of a CEM may include at least one of a strong electron potential due to localization, and/or a correlation of electrons, for example. Also, in an embodiment, a difference in the set voltage and the reset voltage may provide an indication of a size of at least one of a write/program window.

As mentioned above, a CES device, also referred to as a variable impeder device, such as variable impeder device 100, may be implemented in a wide range of electronic device types. For example, a variable impeder device, such as variable impeder device 100, may be utilized in logic circuits, memory circuits, filter circuits, etc. Generally speaking, a variable impeder device, such as variable impeder device 100, may be utilized in any circuit or device, presently existing or to exist in the future, that may benefit from the variable impeder device's variable resistance and/or variable capacitance characteristics.

For example, in an embodiment, a CES device, such as variable impeder device 100, may be implemented in a memory cell, for example. In one or more embodiments, a CES memory may comprise: a variable impeder memory cell including a CES; a write circuit for placing the variable impeder memory cell in a first impedance state or a second impedance state depending on signals provided to the memory device; and a read circuit for sensing an impedance state of the memory cell and providing an electrical signal corresponding to the sensed state of the memory cell. In one aspect, an impedance of a CES in the second memory cell state may be significantly greater than the impedance in the first memory cell state.

Integrated circuits, such as example integrated circuits discussed herein, may include multiple layers of material that may be built on a substrate. Layers of material may include one or more electrically conductive layers, sometimes referred to as "metal" layers and/or "metallization" layers that may interconnect with circuit devices. As used herein, the terms "metal layer" and/or "metallization layer" refer to electrically conductive electrodes, otherwise referred to as "lines" that may be formed from an electrically conductive material. Example materials for a metal layer or metallization layer may include, for example, aluminum and/or copper, to name but a couple of examples. Vias formed between metallization layers may also be formed of electrically conductive materials such as polysilicon, tungsten, copper, and/or aluminum, for example. Of course, claimed subject matter is not limited to these specific examples.

Also, as used herein, the term "substrate" may include silicon-on-insulator (SOI) or silicon-on-sapphire (SOS) technology, doped and/or undoped semiconductors, epitaxial layers of silicon supported by a base semiconductor foundation, conventional metal oxide semiconductors (CMOS), e.g., a CMOS front end with a metal backend, and/or other semiconductor structures and/or technologies, including CES devices, for example. Various circuitry, such as driver and/or decode circuitry, for example, associated with operating a programmable fabric and/or memory array may be formed in and/or on a substrate. Furthermore, when reference is made to a "substrate" in the following description, previous process steps may have been utilized to form regions and/or junctions in the base semiconductor structure or foundation.

Additionally, in an embodiment, CES devices may be implemented in middle-of-line (MOL) and/or back-end-of-line (BEOL) processes for an integrated circuit. For example, because a CES device may be formed directly on a source and/or drain region of a transistor formed in an integrated circuit device, and because a CES device may also be directly coupled to an electrically conductive line of a metal layer, a CES device may serve as a sort of connector between a source and/or drain region and an electrically conductive line of a metal layer, for example. Thus, as may be seen in the examples that follow, CES devices may be implemented in any of a number of layers of an integrated circuit device, and may also be implemented in any of a wide range of configurations.

According to an embodiment, "layers" of a structure or a device may be formed using any material using any particular process. In one example, a layer of material (e.g., CEM, semiconductor material or metal) may be formed over a wafer using any one of several processes such as, for example, chemical vapor deposition or sputter deposition. In addition, techniques such as masking and etching may be used to create localized variations in a structure or device (e.g., formation of vias through one or more preformed layers). According to an embodiment, layers of CEM may be formed depositing CEM on a surface or substrate to form a CEM device (e.g., CES or CeRAM device). Additional structures, such as gates, transistors, etc., may be formed in conjunction with the CEM device using additional processes for forming complementary metal oxide semiconductor (CMOS) devices.

Figure 4A:
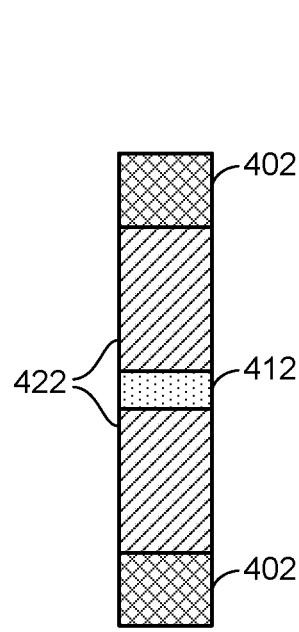
FIGS. 4A through 4E are diagrams illustrating CES devices formed using correlated electron material (CEM) with different structural dimensions in accordance with an embodiment.

FIGS. 4A through 4E are diagrams illustrating devices formed using correlated electron material (CEM) with different structural dimensions in accordance with an embodiment. As pointed out above, a device may be formed from one or more layers of CEM and conductive terminals. In FIG. 4A, for example, one or more layers of CEM (such as including a TMO or other CEM discussed above without limitation) are formed between terminals 402 where layers 422 comprise CEM with a p-type dopant and layer 412 comprises an intrinsic CEM (e.g., non-doped) portion. As pointed out above, the device of FIG. 4A may be configured as a variable resistor or impeder device.

According to an embodiment, the CEM device of FIG. 4A may be formed to behave as a CES in a circuit in that the CEM device may be switchable between a low impedance or conductive state and a high impedance and insulative state (e.g., as discussed above with reference to FIG. 3). Here, layer 412 may comprise a "switching region" in which a Mott transition or Mott-like transition may occur (e.g., in response to a set or reset condition). While a localized impedance of a switching region formed by layer 412 may switch between a high impedance and a low impedance in an operative circuit, layers 422, on the other hand, may remain in the same conductive state in the operative circuit and provide "conductive regions" within the device. It should be understood, however, that the specific structure of the device of FIG. 4A with layer 412 forming a switching region that separates layers 422 forming conductive regions is merely an example structure for forming a CES, and that other different structures may be used without deviating from claimed subject matter. For example, embodiments shown in FIGS. 6A through 6E below are examples of structures that may be used to form a CES that does not have a distinct switching region formed by one or more CEM layers separating conductive regions formed by differently doped CEM layers.

According to embodiments, a resistance or impedance R of the device 4A may be determined based, at least in part on the dimensions of the device and resistivity of CEM layers formed between terminals 402 according to expression (6) as follows:

$$R = \rho \frac{l}{A} \quad (6)$$

where:
ρ is the resistivity of the CEM used to form layers between terminals 402;
A is the cross-sectional area of the device; and
l is the length of the device.

Figure 4B:
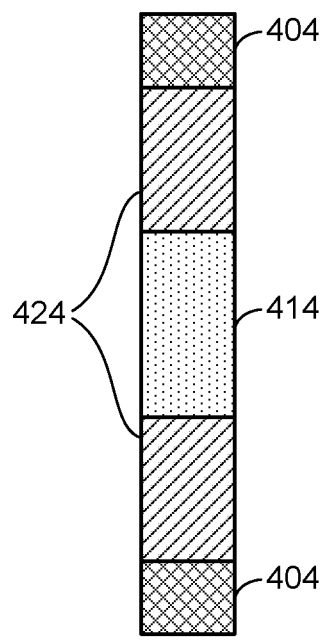
Figure 4C:
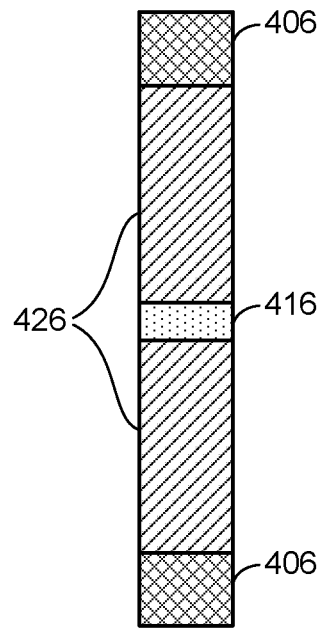
Figure 4D:
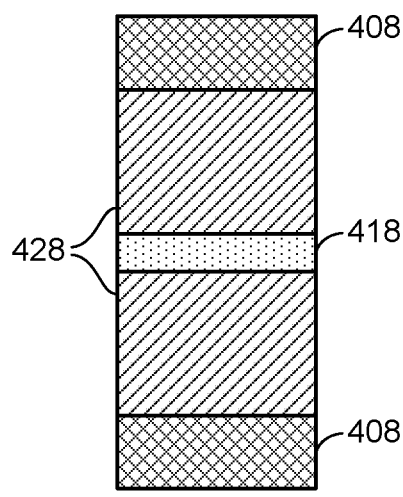
Figure 4E:
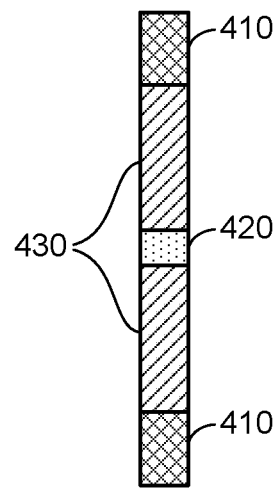
Figure 4F:
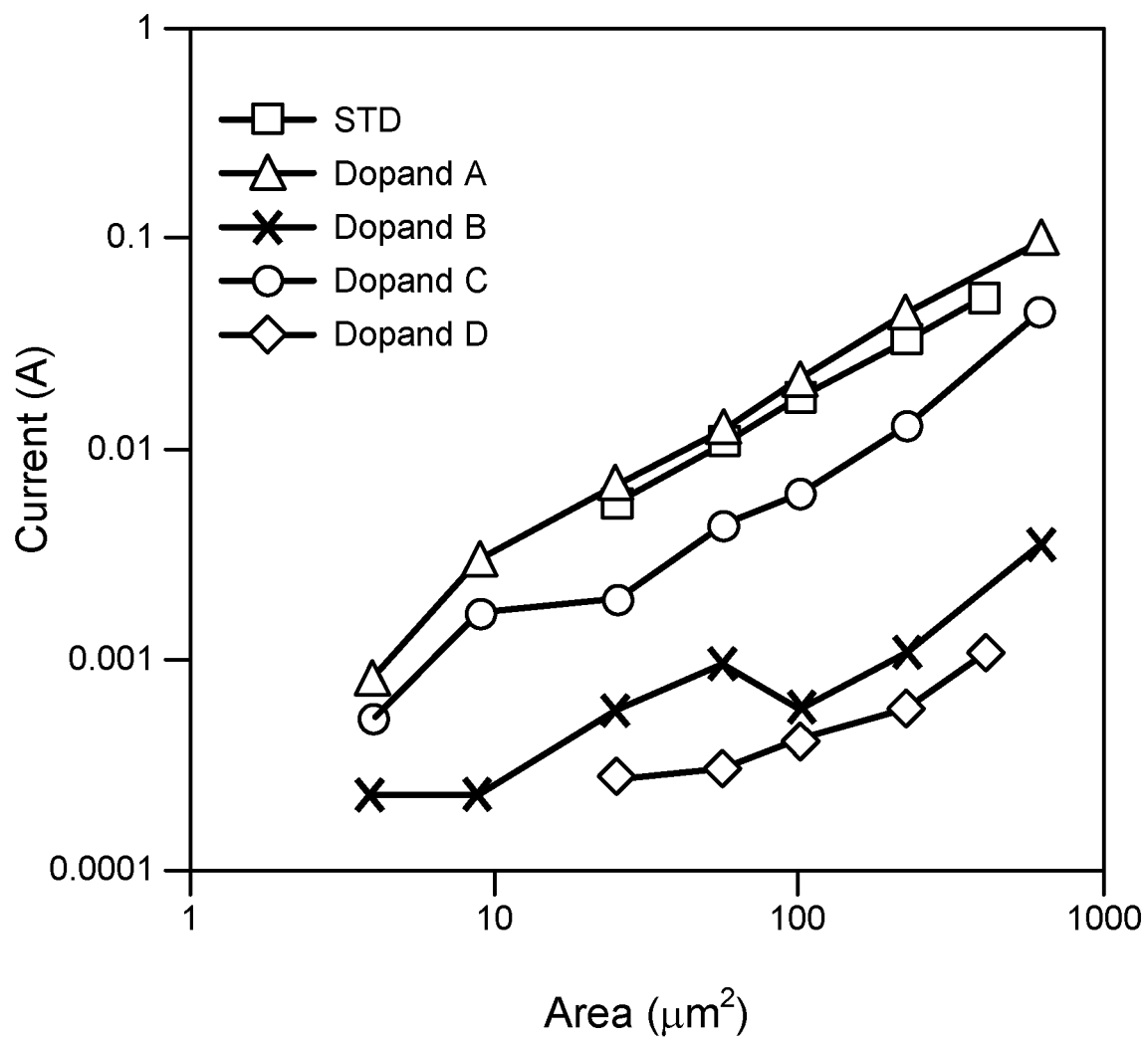
FIG. 4F is a plot illustrating variations of resistivity of a CEM from doping.

Resistivity ρ of a layer of CEM in a device may be determined based, at least in part, on particular CEM used (e.g., type of TMO) and any dopant applied. FIG. 4F illustrates different resulting for particular different dopants applied to CEM in a device. In particular implementations, a resistance or impedance of the device of FIG. 4A may be altered by changing the dimensions of the device (as illustrated by expression (6)) and thickness of an intrinsic portion 412 relative to p-type doped portions 422. For example, the device in FIG. 4C is shown to be longer than the device of FIG. 4A by having longer p-type doped layers 426 (increasing values of l for p-type doped portions 426), imparting a larger impedance or resistance. The device of FIG. 4B is longer than the device of FIG. 4A by having a longer intrinsic portion 414 (increasing value of l for intrinsic non-doped portion 414), also imparting a larger impedance or resistance. The device of FIG. 4D is shown to be wider than the device of FIG. 4A imparting smaller resistance (e.g., by increasing a value for A). Conversely, the device of FIG. 4E is shown to be narrower than the device of FIG. 4B imparting a larger resistance (e.g., by decreasing a value for A).

Figure 5A:
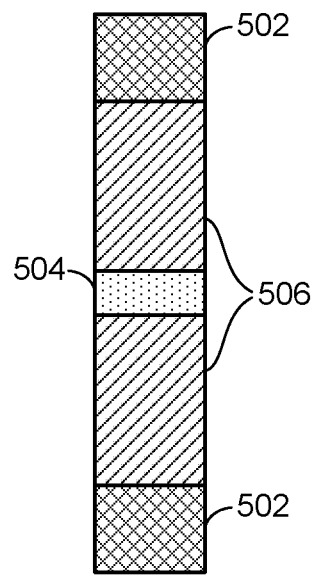
FIGS. 5A through 5D are diagrams illustrating different approaches to doping portions of a device formed from CEM according to an embodiment.
Figure 5B:
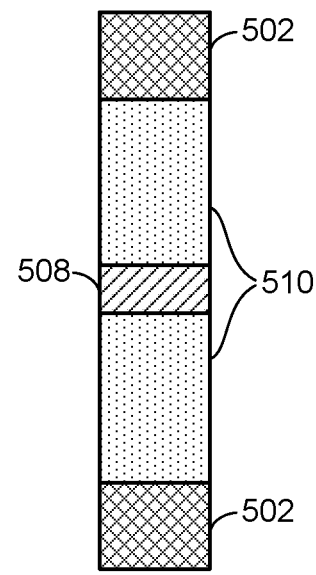
Figure 5C:
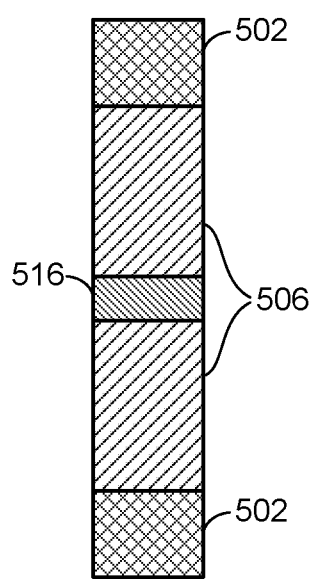
Figure 5D:
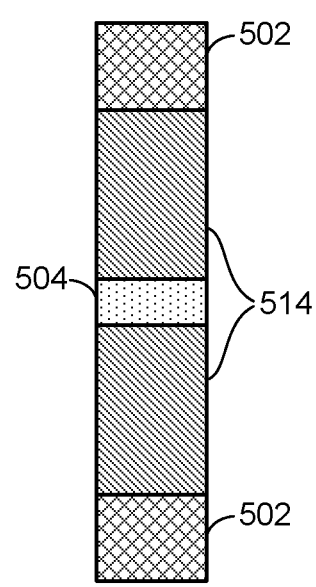
Figure 6A:
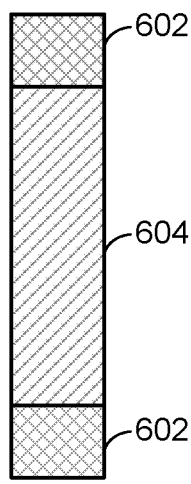
FIGS. 6A through 6E are diagrams illustrating devices formed using correlated electron material CEM in a single bulk material without a distinct switching region in accordance with an embodiment.
Figure 6B:
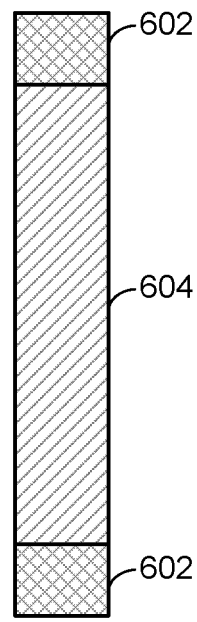
Figure 6C:
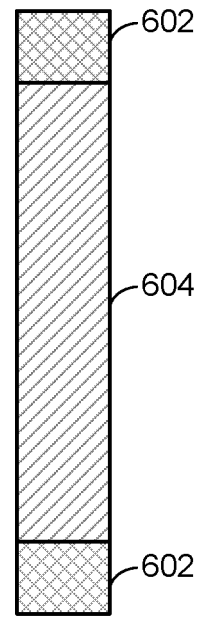
Figure 6D:
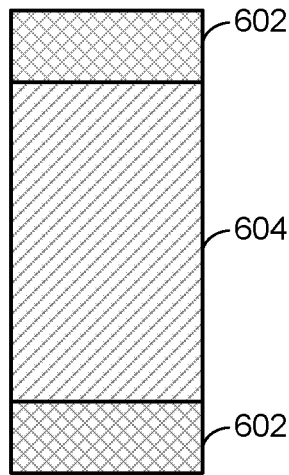
Figure 6E:
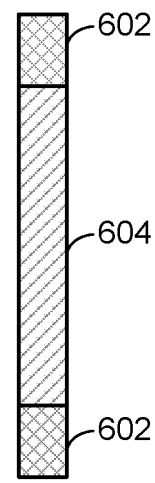

In the particular embodiments of FIGS. 5A through 5D, a resistance or impedance of a CEM device may be may be further affected by affecting doping in individual layers between terminals 502 of a device. The device of FIG. 5A includes p-type doped layers 506 and layer 504 formed from intrinsic non-doped CEM. As pointed out above, the device of FIG. 5A may be formed as a CES by forming layer 504 as a switching region and forming layers 506 as conductive regions. In the device of FIG. 5B, a layer 508 is p-type doped while layers 510 are formed as intrinsic non-doped layers. In the device of FIG. 5C, layers 512 are p-type doped while layer 516 is doped with a different dopant (e.g., n-type dopant or a different p-type dopant). In the device of FIG. 5D, layer 504 remains intrinsic or undoped while layers 514 are formed with a dopant different from a dopant used in forming layers 506 in the device of FIG. 5A.

Any of the devices of FIGS. 5A through 5D may be formed to behave as a CES in an operational circuit. For example, the device of FIG. 5A may be formed as a CES by forming layer 504 as a switching region and forming layers 506 as conductive regions. Layers 508 and 516 of the devices of FIGS. 5B and 5C may similarly be formed as switching regions while layers 510 and 512 may be formed as conductive regions.

As illustrated in FIGS. 5A though 5D, a CES may comprise a switching region comprising one or more layers of CEM that is doped differently from layers of CEM used to form conductive regions of the device. For example, conductive regions may be formed with p-type doped CEM while a switching region separating the conductive regions may be formed with intrinsic/non-doped CEM (e.g., device of FIG. 5A) or CEM that is n-type doped (e.g., device shown in FIG. 5C). Alternatively, conductive regions may be formed from intrinsic/non-doped CEM while a switching region is formed from p-type doped CEM (e.g., device shown in FIG. 5B) or n-type doped CEM while a switching region is formed from intrinsic/non-doped CEM (e.g., FIG. 5D) or p-type doped CEM.

FIGS. 6A through 6E are diagrams illustrating devices formed using correlated electron material (CEM) in a single bulk material with different structural dimensions in accordance with an embodiment. Devices of FIGS. 6A through 6E are shown as having different dimensions of CEM portion 604 formed between terminals 602. CEM portion 604 comprises a single continuous conductive region between terminals 602 that is doped according to a profile without any particular intervening switching region. In one example process of forming a device shown in FIGS. 6A through 6E, a first (or bottom) terminal 602 may be formed by, for example, formation of a first layer of electrode material such as, for example, a using any one of several metal deposition techniques. Here, an electrode material may comprise, as examples and without limitation, a titanium-based and/or titanium-containing substrate, such as titanium nitride (TiN), fabricated in layers, for example, for use in a CES device or other type of CEM-based device. In other embodiments, an electrode material may comprise other types of conductive materials, such as titanium nitride, platinum, titanium, copper, aluminum, cobalt, nickel, tungsten, tungsten nitride, cobalt silicide, ruthenium oxide, chromium, gold, palladium, indium tin oxide, tantalum, silver, iridium, or any combination thereof, and claimed subject matter is not limited to any particular composition of an electrode material. Portion 604 may be formed by a continuous deposition of CEM directly on the first metal layer (e.g., with no other intervening material deposited on the metal layer prior to deposition of the CEM). A second (or top) terminal 602 may be formed by formation of a second layer of electrode material directly on portion 604 (e.g., with no other intervening material deposited on portion to formation of the second metal layer). As may be observed, portion 604 comprises a single, continuous conductive portion bordering terminals 602 without any particular intervening switching layer (e.g., no switching layer that is formed by deposition of a non-doped or differently doped CEM as illustrated by switching layers 504, 508 and 516 shown in FIGS. 5A through 5D).

As pointed out above, conductive portions 604 may be formed from a p-type doped CEM using any one of several suitable deposition techniques. In alternative implementations, conductive portions 604 may be formed from an n-type doped CEM. In one embodiment, a concentration of p-type dopant applied in formation of portion 604 may be uniform between terminals 402. In other embodiments, a concentration of p-type dopant at portions between terminals 602 may vary. For example, a concentration of p-type dopant in portion 604 may increase or decrease according to a gradient from a first terminal 602 to a second terminal 602.

In particular implementations, devices shown in FIGS. 6A through 6E may be implemented or configured to perform as a CES device, CeRAM device or any other suitable application of a CEM device formed. For example, layer 604 may be formed to have an impedance state that switchable between a conductive or low impedance state and an insulative or high impedance state in an operational circuit (e.g., in response to a Mott transition or Mott-like transition). As such, any reference to a CES, CeRAM, correlated electron device and/or the like made herein is not limited to structures that include conductive regions separated by a switching region as illustrated in FIGS. 4A through 4D and 5A through 5D, and may include devices formed from a single (e.g., without a intervening switching region separating conductive regions formed by one or more layers of CEM) as illustrated in FIGS. 6A through 6E.

According to an embodiment, a device (e.g., as shown in FIGS. 6A through 6E) may comprise: first and second terminals; and a continuous region of correlated electron material (CEM) formed between the first and second terminals, the continuous region being contiguous with the first and second terminals, the continuous region of CEM being p-type doped. In one alternative implementation, a concentration of the p-type dopant in the continuous region of CEM is non-uniform between the first and second terminals. In another alternative implementation, a concentration of the p-type dopant in the continuous region of the CEM is according to an increasing gradient from the first terminal to the second terminal. In an alternative embodiment, the continuous region of CEM may be n-type doped.

According to an embodiment, a device (e.g., as shown in FIGS. 6A through 6E) may be formed by: forming a first metal layer comprising first electrode of a device; depositing one or more layers of correlated electron material (CEM) on the first layer; and forming a second metal layer on the one or more layers of CEM comprising a second electrode, wherein the one or more layers of CEM comprise a continuously p-type doped region between the first and second electrodes. In an alternative embodiment, the continuous region of CEM may be n-type doped. In one particular implementation, a concentration of the dopant in the continuous region of CEM is non-uniform between the first and second terminals. In another particular implementation, a concentration of the p-type dopant in the continuous region of the CEM is according to an increasing gradient from the first terminal to the second terminal.

Figure 7A:
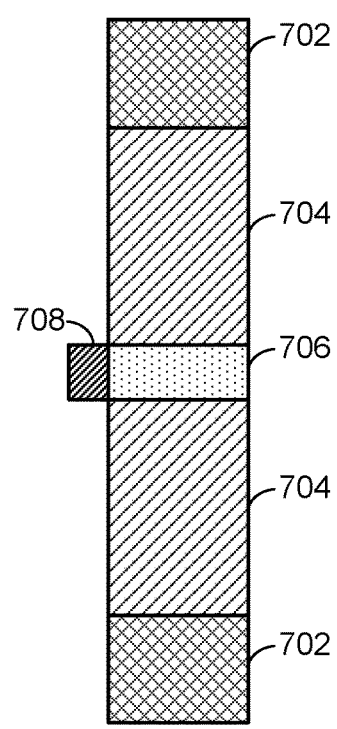
FIGS. 7A, 7B and 7C are diagrams illustrating a device formed from CEM with three or more terminals in accordance with an embodiment.
Figure 7B:
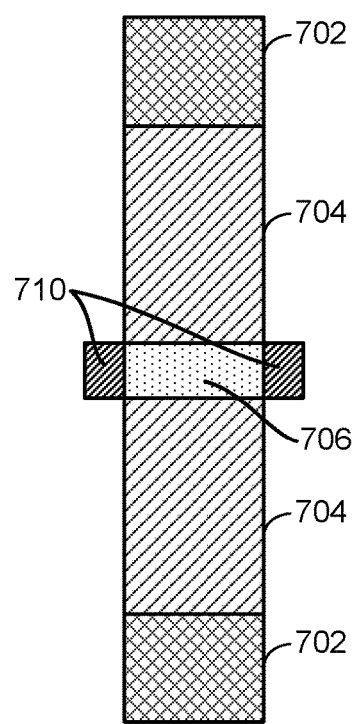
Figure 7C:
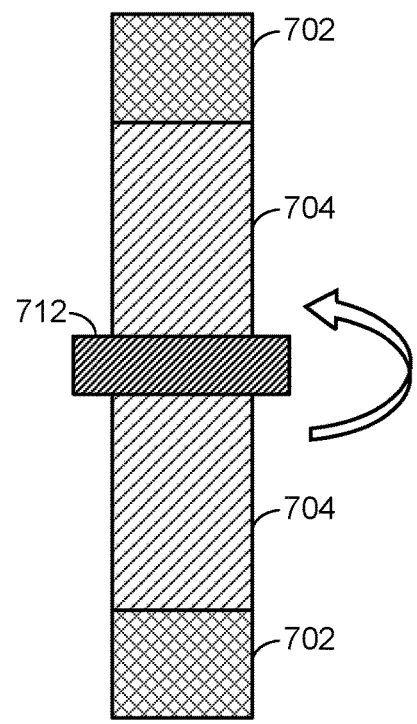

FIGS. 7A, 7B and 7C are diagrams illustrating a device formed from CEM with three or more terminals in accordance with an embodiment. Here, a switching region 706 may be formed between conductive regions 704 (e.g., where switching region 706 is doped differently from conductive regions 704) formed between terminals 702 formed as electrode terminals (e.g., from deposition of an electrode material). In FIG. 7A, a device further includes a gate terminal 708 coupled to switching region 706. According to an embodiment, the device of FIG. 7A may have a particular state detectable at electrode terminals 702 such as, for example, an impedance state (e.g., an insulative or high impedance state, or a conductive or low impedance state). According to an embodiment, a signal applied to gate terminal 708 (and applied to switching region 706) may affect the detectable state. For example, a particular voltage applied to gate terminal 708 may induce a Mott transition or Mott-like transition of material in switching region 706 to change the detectable state between a conductive or low impedance state and an insulative or high impedance state. In particular embodiments, the device of FIG. 7A may be implemented in a circuit as a multi-state logic device.

In the example embodiment of a device in FIG. 7B, gate terminal 708 may be replaced with a pair of gate terminals 710 that may receive a signal affecting the detectable state of the device. In the example, embodiment of a device in FIG. 7C, gate terminal 708 may be replaced with three or more gate terminals 712 that may receive a signal affecting the detectable state of the device.

According to an embodiment, a device (e.g., as shown in FIGS. 7A through 7C) may comprise: first and second electrode terminals; one or more layers of CEM formed between the first and second terminals; and one or more gate terminals coupled to the one or more layers of CEM, wherein a state of the one or more layers of CEM is switchable between or among a plurality of states responsive to one or more signals applied to the one or more gate terminals. In one particular implementation, the state of the one or more layers of CEM is switchable to change an impedance between the first and second electrode terminals.

According to an embodiment, a device (e.g., as shown in FIGS. 7A through 7C) may be formed by: forming one or more layers of a CEM between first and second electrode terminals; and forming one or more gate terminals to be coupled to the one or more layers of the CEM to enable switching of a state of the one or more layers of CEM between or among a plurality of states.

According to an embodiment, the one or more gate terminals may be formed in or coupled to a switching region of the one or more layers formed between conductive regions. In a particular implementation, a switching region may be formed from one or more layers of intrinsic CEM while the conductive regions are formed from one or more layers of p-type doped CEM. In an alternative implementation, a switching region may be formed from one or more layers of p-type doped CEM while the conductive regions are formed from one or more layers of intrinsic CEM.

Figures 8A, 8B:
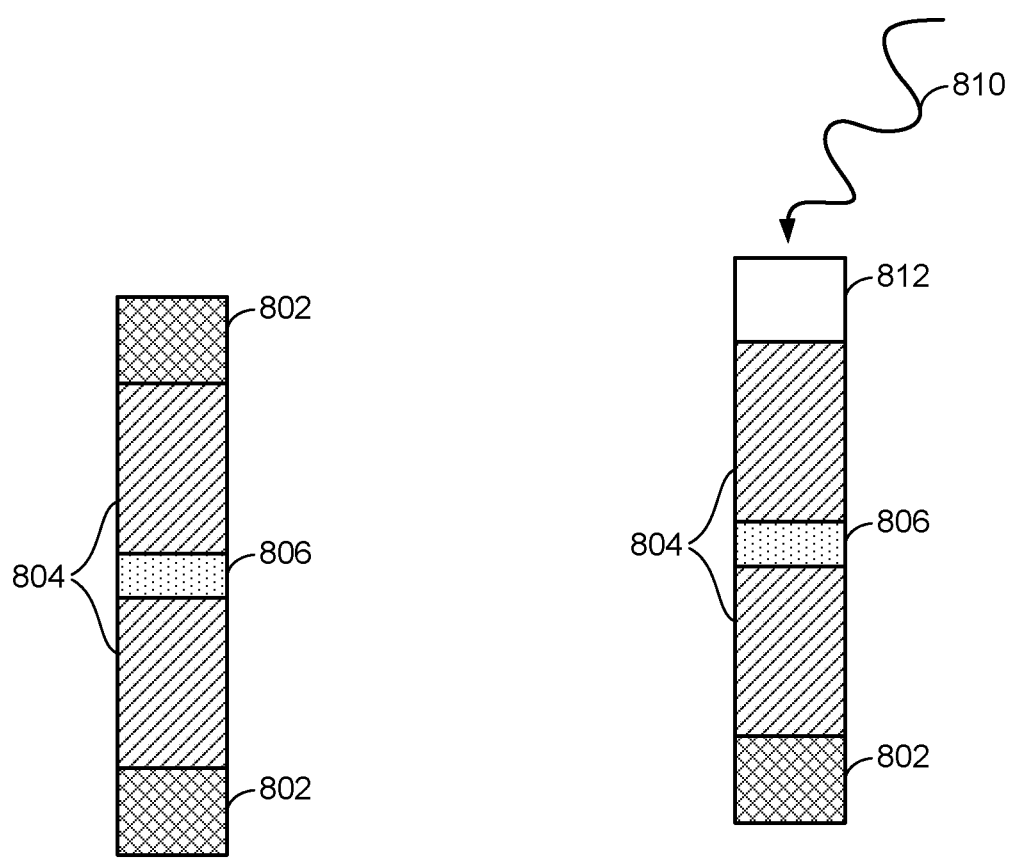
FIGS. 8A and 8B are diagrams illustrating a device formed from CEM having a state that may be affected by exposure to light in accordance with an embodiment.

FIGS. 8A and 8B are diagrams illustrating a device formed from CEM having a state that may be affected by exposure to light in accordance with an embodiment. FIG. 8A shows a device formed from CEM (e.g., CES element, CeRAM element, etc.) comprising conductive regions 804 separated by a switching region 806 formed between terminals 802. The device of FIG. 8A may have any one of multiple states detectable at terminals 802 such as, for example, a conductive or low impedance state, or an insulative of low impedance state (e.g., as illustrated in FIG. 3). The particular detectable state may be affected or changed in response to a Mott transition or Mott-like transition as described above (e.g., in response to a set or reset operation including application of a particular voltage and current across terminals 802).

In the particular implementation of FIG. 8B, a terminal 802 may be replaced with an at least partially light-permeable electrode 812 formed over one an adjacent conductive portion 804. In this context, a light-permeable electrode portion 804 comprises a structure of material that permits light impinging on a surface of the structure to be pass through at least a portion of the structure. Light-permeable electrode 812 may also comprise a conductive portion in contact with conductive region 804. In a particular implementation, at least partially light-permeable electrode 812 may be formed by depositing material that allows light for a particular wavelength or spectral band (visible or otherwise) using sputter or CVD deposition techniques, for example. A light signal 810 received at light-permeable electrode 812 may excite CEM in conductive portion 804 to generate a current/voltage affecting a detectable state of switching region 806. For example, terminal 802 opposite light permeable electrode 812 may be maintained at a particular voltage while a voltage/current is applied to switching region 806 responsive to light signal 810 to effect a Mott or Mott-like transition (e.g., changing between a conductive or low impedance state and an insulative or high impedance state). The device of FIG. 8B may be implemented as a photodetector or other photosensitive logic device, for example.

According to an embodiment, a device (e.g., as shown in FIG. 8B) may comprise: one or more layers of a correlated electron material (CEM); one or more electrodes coupled to the one or more layers of CEM; and an at least partially light-permeable electrode formed over the one or more layers, wherein the one or more layers of CEM are adapted to change a state that is detectable at the one or more electrodes in response to light impinging the at least partially light-permeable contact surface. In a particular implementation, a switching region may be formed from one or more layers of intrinsic CEM while the conductive regions are formed from one or more layers of p-type doped CEM. In an alternative implementation, a switching region may be formed from one or more layers of p-type doped CEM while the conductive regions are formed from one or more layers of intrinsic CEM.

According to an embodiment, a device (e.g., as shown in FIG. 8B) may be formed by: forming one or more layers of correlated electron material (CEM); forming one or more electrodes coupled to the one or more layers of CEM; and forming an at least partially light-permeable contact surface over the one or more layers of CEM, wherein the one or more layers of CEM are adapted to change a state that is detectable at the one or more electrodes in response to light impinging the at least partially light-permeable contact surface.

Figure 9A:
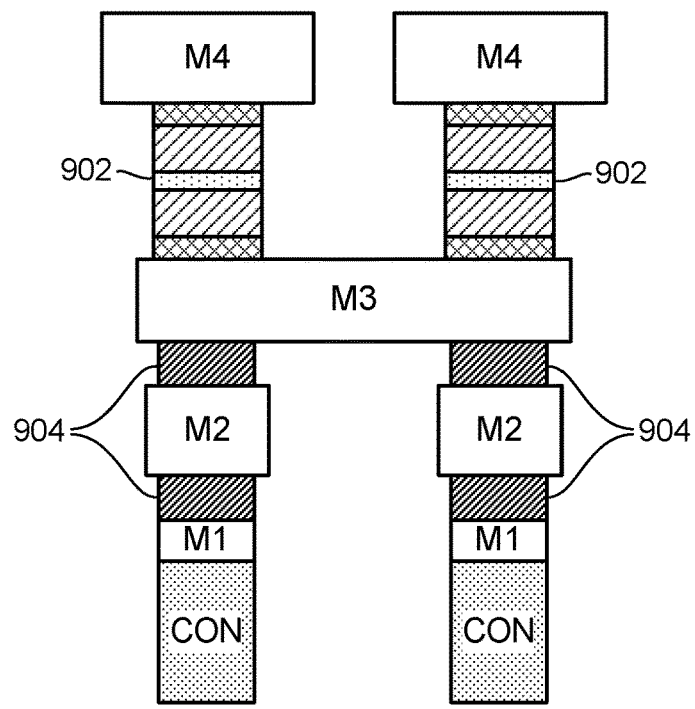
FIGS. 9A and 9B are diagrams illustrating structures including devices formed from CEM having a resistance or impedance state that does not change in an operational circuit according to an embodiment.

In particular implementations, devices formed as illustrated in FIGS. 4A through 4D, 5A through 5D and 6A through 6E may be implemented in a circuit as a CES, CeRAM or other device (e.g., other logic device) having a detectable state that changes in response to particular events (e.g., change in impedance state in response to a set or reset operation). In other implementations, a device may be formed from one or more layers of CEM between terminals to have a static state such as a static impedance or resistance between the terminals. In a particular implementation, processes may form devices that include CEM having a switchable state (e.g., CES, CeRAM or other logic device) and devices that include CEM having a static state (e.g., a device having a static impedance or resistance). As shown in FIG. 9A, devices 902 may be formed to have a switchable impedance state while devices 904 may be formed to have a static impedance state. Similarly as shown in FIG. 9B, devices 912 may be formed to have a switchable impedance state while devices 906 may be formed to have a static impedance state.

Figure 9B:
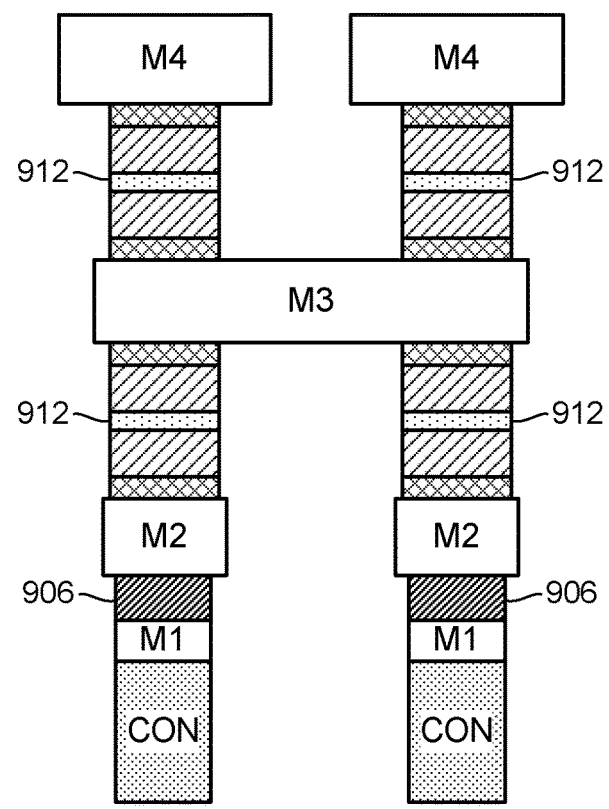

According to an embodiment, the structures shown in FIGS. 9A and 9B may be configured to operate as variable resistors or variable impeders including portions formed with one or more layers of CEM to have a static impedance (e.g., portions 904 and 906) in series with one or more layers of CEM to have a switchable impedance (e.g., portions 902 and 912).

A device may be formed from one or more layers of a particular CEM to have a switchable state (e.g., portions 902 and 912 shown in FIGS. 9A and 9B) or a static state (e.g., portions 904 or 906 shown in FIGS. 9A and 9B) by affecting doping applied to deposited layers. Particular example structures of a device formed from CEM shown in FIGS. 10A and 10C may be implemented in a circuit to have a switchable state. The device of FIG. 10A includes p-type doped conductive regions and an intrinsic/non-doped switching region. The device of FIG. 10C includes intrinsic/non-doped conductive regions and a p-type doped switching region. It should be understood, however, that the structures shown in FIGS. 10A and 10B are merely example structures of devices having a state that is switchable in an operational circuit, and claimed subject matter is not limited in this respect.

Particular example structures of a device formed from CEM shown in FIGS. 10B and 10D may be implemented in a circuit to have a static or non-switchable state (e.g., a static resistance or impedance state). The device of FIG. 10B includes n-type doped conductive regions and an intrinsic/non-doped switching region. The device of FIG. 10C includes intrinsic/non-doped conductive regions and an n-type doped switching region. It should be understood, however, that the structures shown in FIGS. 10B and 10D are merely example structures of devices having a static that is not switchable in an operational circuit, and claimed subject matter is not limited in this respect.

According to an embodiment, a device as shown in FIG. 10B or 10D may comprise: one or more layers of correlated electron material (CEM); and first and second terminals coupled to the one or more layers of CEM, wherein the one or more layers are formed such that an impedance state of the one or more layers of CEM does not substantially change if the device is implemented in a particular operational circuit. In one alternative implementation, the CEM may comprise an n-type doped transition metal oxide. In another alternative implementation, the one or more layers are formed so as to inhibit a Mott transition or Mott-like transition while the device is implemented in the particular operational circuit.

In one implementation, a device as shown in FIG. 10B may be formed by depositing one or more first layers of an n-type doped CEM, followed by depositing one or more layers of intrinsic CEM on the one or more first layers of n-type doped CEM, followed by depositing one or more second layers of n-type doped CEM on the one or more layers of intrinsic CEM. In another a device as shown in FIG. 10D may be formed by depositing one or more first layers of an intrinsic CEM, followed by depositing one or more layers of an n-type doped CEM on the one or more first layers of intrinsic CEM, followed by depositing one or more second layers of intrinsic CEM on the one or more layers of n-type doped CEM.

Figure 11:
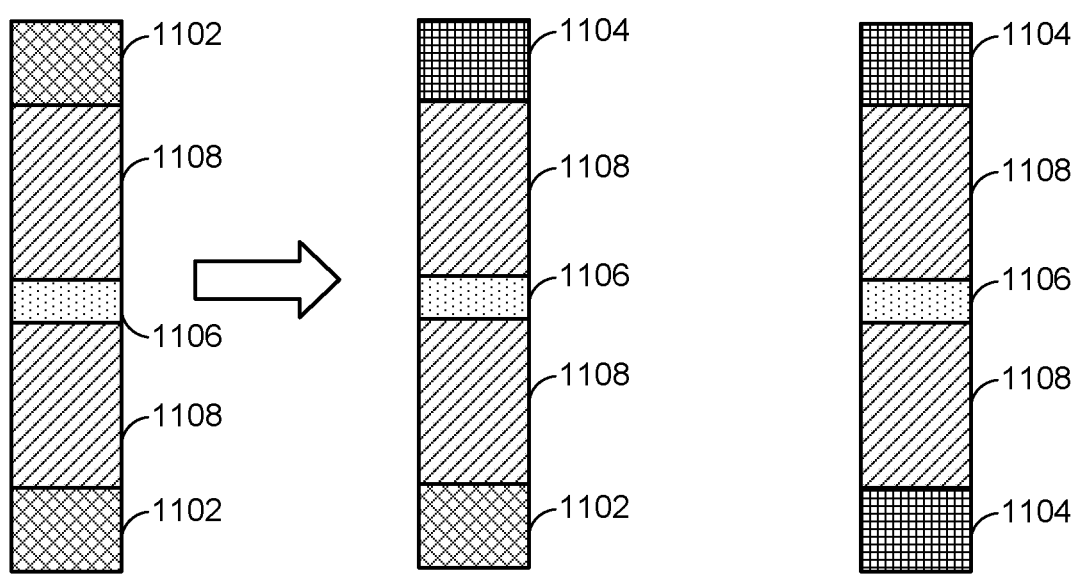
FIG. 11 is a diagram of a structure including one or more layers of CEM formed on a semiconductor according to an embodiment.

In some implementations discussed above, a device such as a CES or CeRAM device may comprise layers of CEM formed between terminals formed by metallic layers. As illustrated in FIG. 11, first terminal 1102 of a device may be formed from deposition of an initial layer formed from electrode material. Following deposition of the initial layer of electrode material, one or more layers of CEM may be deposited on the initial layer of electrode material (e.g., to form conductive regions 1108 and an intervening switching region 1106 separating the conductive regions 1108). A second layer of electrode material may be formed on the one or more layers of CEM to form a second terminal 1102 of the device.

According to an embodiment, one or both of the terminals 1102 (e.g., formed from deposition of electrode material) may be omitted such that the one or more layers of CEM are formed directly on a semiconductor device (e.g., CMOS device) without any intervening terminal formed from electrode material such as a metal. For example, a terminal 1102 may be omitted and replaced with a region of a semiconductor device 1104 such as a transistor or other logic device. In one particular implementation, one or more layers of CEM of a device (e.g., a CES device, CeRAM device or other logic device) may be formed directly on a region 1104 formed as a source or drain region of CMOS FET without any intervening metallic layer. Similarly, one or more layers of CEM of a device may be formed directly on a region 1104 formed as an emitter or collector region of a CMOS bipolar junction transistor without any intervening metallic layer. As further illustrated in FIG. 11, a second terminal 1102 may be similarly replaced with a region of a semiconductor device without any intervening metal layer.

According to an embodiment as shown in FIG. 11, a device may comprise: one or more layers of correlated electron material (CEM); and one or more layers of a semiconductor material formed on the one or more layers of CEM without an intervening metal layer. In one alternative implementation, the one or more layers of semiconductor material comprise source or drain region of a field effect transistor in contact with the one or more layers of CEM. In another alternative implementation, the one or more layers of semiconductor material may comprise a source or drain region of a field effect transistor in contact with the one or more layers of CEM. In another alternative implementation, the one or more layers of semiconductor material may comprise an emitter or collector region of a bi-polar junction transistor in contact with the one or more layers of CEM. In another alternative implementation, the one or more layers of semiconductor material may comprise a first terminal of a correlated electron switch (CES) and the device may further comprise a metal layer in contact with the one or more layers of CEM to provide a second terminal of the CES. In a particular implementation, a switching region may be formed in from one or more layers of intrinsic CEM while the conductive regions are formed from one or more layers of p-type doped CEM. In an alternative implementation, a switching region may be formed from one or more layers of p-type doped CEM while the conductive regions are formed from one or more layers of intrinsic CEM.

Figures 12A, 12B, 12C:
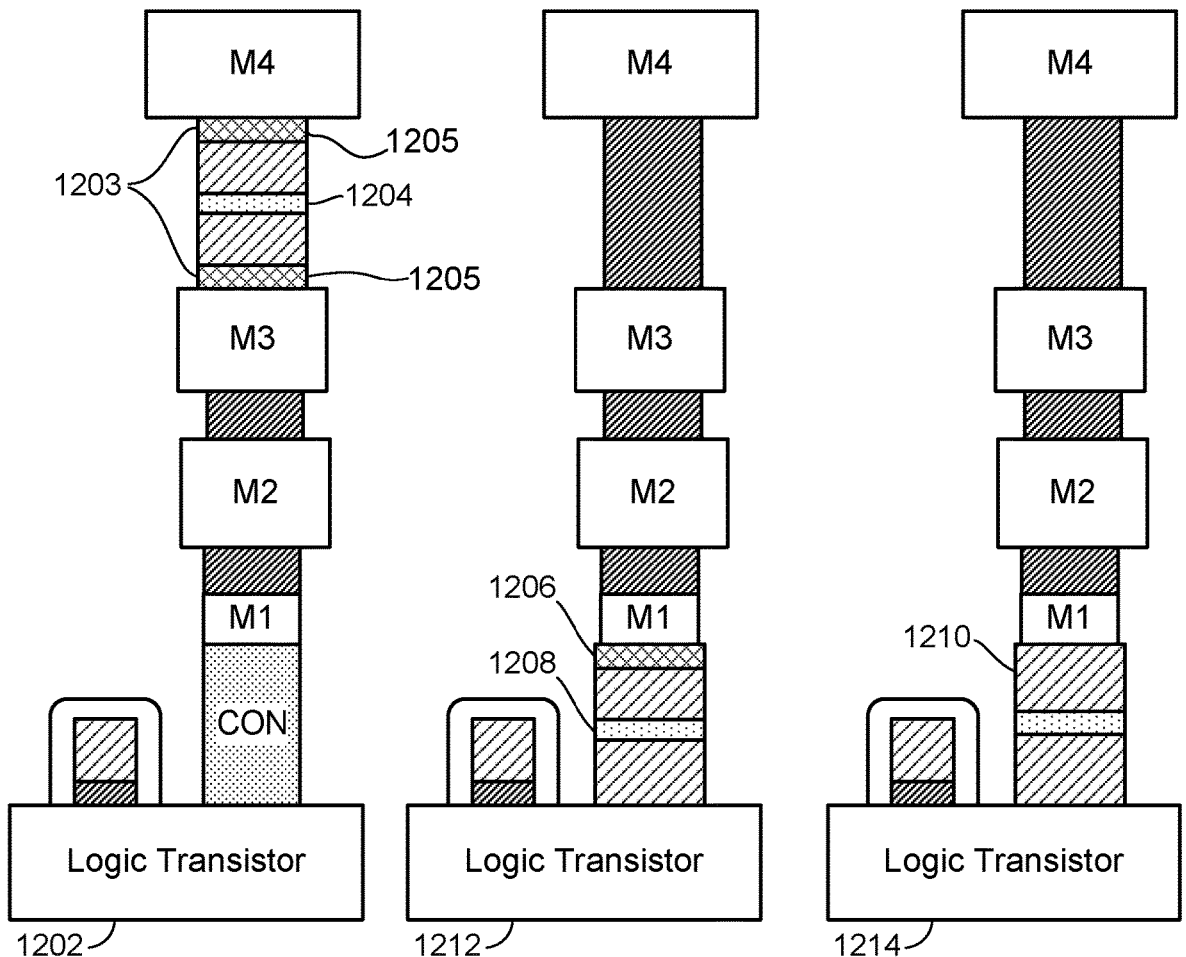
FIGS. 12A through 12C are diagrams of structures integrating a logic transistor with a device formed from CEM according to particular embodiments.

FIGS. 12A through 12C are diagrams of structures integrating a logic transistor with a device formed from CEM according to particular embodiments. In FIG. 12A, a logic transistor 1202 is integrated with a CEM device 1204 with multiple intervening layers including metal layers M1, M2 and M3. CEM device is shown to include one or more layers of CEM between electrode portions 1203 (which may be formed as metal layers). In the particular implementation of FIG. 12A, metal layer M3 may comprise a planar structure to form horizontal connections between structures formed above or below metal layer M3 and/or comprise a metal via. A first layer of electrode material may be deposited on metal layer M3 to form a first electrode 1203, followed by deposition of layers of CEM to form switching region 1204 and conductive regions 1205, followed by deposition of a second layer of electrode material to form a second electrode 1203. According to an embodiment, portions of layers deposited between layers M3 and M4 may be etched to form a "stack" structure as shown. Metal layer M4 may then be formed over the second electrode 1203.

In the particular implementation of FIG. 12B, one or more layers of CEM 1208 forms conductive regions separated by a switching region of a device that is formed directly on a portion of a logic transistor 1212 (e.g., formed from a semiconductor such as CMOS, germanium, etc.) with no intervening additional contact or terminal layer (e.g., no intervening layer of electrode material). In a particular implementation, a switching region may be formed from one or more layers of intrinsic CEM while the conductive regions are formed from one or more layers of p-type doped CEM. In an alternative implementation, a switching region may be formed from one or more layers of p-type doped CEM while the conductive regions are formed from one or more layers of intrinsic CEM. FIG. 12B also shows that an electrode 1206 may be formed on the one or more layers of CEM 1208 before formation of metal layer M1. In the particular implementation of FIG. 12C, one or more layers of CEM 1210 are similarly formed directly on a logic transistor 1214. However, no electrode is formed between the one or more layers of CEM 1210 and metal layer M1 from deposition of an electrode material forming a device on is further removes a terminal portion of FIGS. 13A through 13G are diagrams depicting structures formed from deposition of CEM according to particular embodiments. FIG. 13A shows a particular structure formed by deposition and etch techniques to form a stack between metal layers Mn and Mn+1. Metal layers Mn and Mn+1 may be formed to provide conductive connections between structures in a plane (e.g., from deposition of layers Mn and Mn+1 and subsequent etching. A first electrode 1302 may be formed form deposition of a first layer of electrode material on metal layer Mn, followed by deposition of a layer to form a first conductive region 1306, followed by a layer to form a switching region 1304, followed by a layer to form a second conductive region 1306, followed by deposition of a second layer of electrode material to form a second electrode 1302, which is followed by formation of metal layer Mn+1 on terminal the second electrode 1302. Electrodes 1302, conductive regions 1306 and switching region 1304 may be formed using any one of several different techniques such as techniques discussed above in connection with FIGS. 4A through 4D and 5A through 5D. In a particular implementation, prior to formation of metal layer Mn+1, layers of electrode material to form electrodes 1302 and layers of CEM to form switching region 1304 and conductive regions 1306 may be etched to form a "stack" structure between metal layers Mn and Mn+1. Voids from etched portions may then be filled with other material (e.g., semiconductive or insulative material).

In the particular implementation, of FIG. 13B, electrodes 1302 of the device of FIG. 13A are omitted. Here, a first conductive region 1306 may be deposited directly on metal layer Mn without any intervening layer of electrode material to form a terminal. Similarly, metal layer Mn+1 may be formed directly on a second conductive region 1306 without any intervening layer of electrode material. This may eliminate processing steps of depositing layers of electrode material to form electrodes 1302 of the device of FIG. 13A.

In the particular implementations of FIGS. 13C and 13D, conductive regions 1306 and switching region 1304 may be formed in as a CEM structure in an etched cavity. For example, a silicon oxide or other substrate may be formed over metal layer Mn (e.g., using deposition), followed by masking and etching the formed substrate to form a cavity. A structure comprising conductive regions 1306 and switching regions 1304 may be formed by appropriate steps of deposition, masking and etching, followed by subsequent deposition. Metal layer Mn+1 may then be formed (e.g., by deposition) directly on a flat surface over the formed switching region 1304 and conductive regions 1306. The devices of FIGS. 13C and 13D include each include a single continuous switching region 1304. The device of FIG. 13D comprises two distinct conductive regions 1306 while the device of FIG. 13C comprises a single conductive region 1306.

Devices in FIGS. 13C and 13D include metal layers Mn+1 formed over a planar surface on a conducive region 1306. Devices shown in FIGS. 13E and 13F differ from devices shown in FIGS. 13C and 13D in that metal layer portion Mn+1 is formed at least partially as a metal structure in an etched cavity. Here, additional steps of masking and etching a portion of a conductive region 1306 may create a cavity to be filled in a subsequent deposition step for the formation of metal portion Mn+1. In alternative implementations, an electrode material may be deposited over metal layer Mn to form an electrode layer between metal layer Mn and CEM layers to form switching regions 1304 and conductive regions 1306. Similarly, in another alternative implementation, an electrode material may be deposited on one or more CEM layers forming a conductive region 1306 to form an electrode layer.

Figure 14:
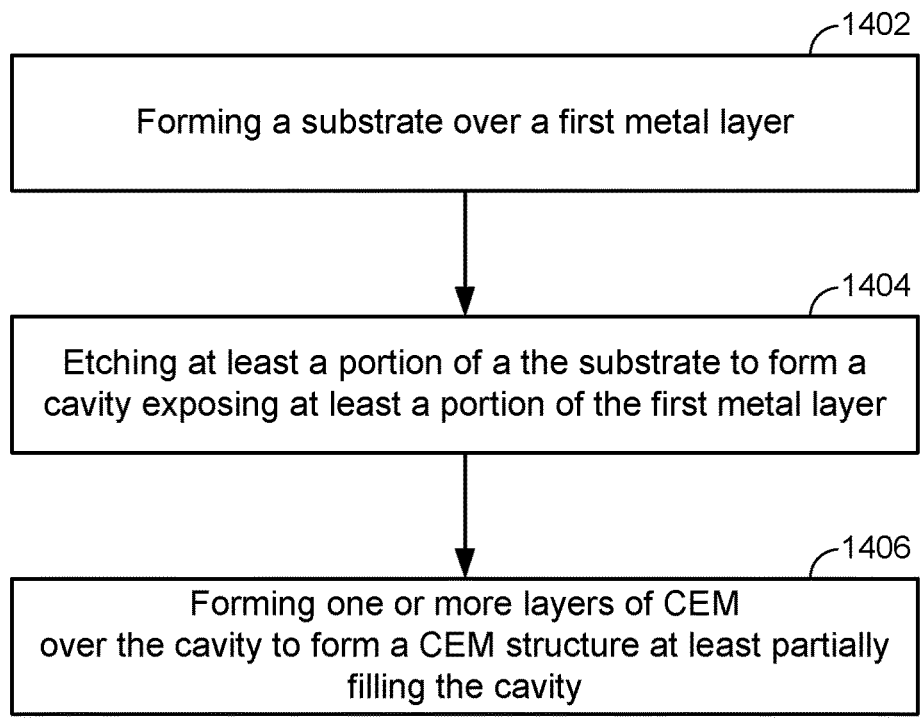
FIGS. 14 and 15 are flow diagrams of processes to form particular devices according to particular embodiments.

FIG. 14 is an example process to form devices as shown in FIGS. 13C, 13D, 13E and 13F according to particular embodiments. A substrate may be formed over a metal layer using any one of several techniques such as deposition. For example, a substrate may formed by depositing material over metal layer Mn. At least a portion of the formed substrate formed over the metal layer may be etched at block 1404 to form a cavity exposing the metal layer (e.g., exposing a portion of metal layer Mn). For example, block 1404 may comprise masking a portion of the substrate leaving a portion exposed to enable localized etching to form the cavity. Block 1406 may deposit one or more layers of CEM over the cavity formed at block 1404 (and on the exposed portion of metal layer Mn) to form a CEM structure at least partially filling the cavity. In particular example implementations, block 1406 may form one or more layers of CEM using any one of several processes including, but not limited to, deposition processes. Such deposition processes may comprise, for example, atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, or the like, to form CEM devices, just to provide a few examples. As shown in the particular examples of FIGS. 13C, 13D, 13E and 13F CEM formed at block 1406 may be deposited with a variety of dopants and doping concentrations to form conductive regions 1306 and switching regions 1304. Here, this may be accomplished using repeated steps of masking, etching and layer formation (e.g., using deposition) to form the particular patterns of conductive regions 1306 and switching regions 1304 show in FIGS. 13C, 13D, 13E and 13F.

Following block 1406, metal portion Mn+1 may be formed as a flat layer over a surface of the CEM structure formed at block 1406 as shown in FIGS. 13C and 13D. Alternatively, following formation of a CEM structure at block 1406, the formed metal structure may be masked and etched to form a second cavity for formation of metal portion Mn+1 as a metal structure filling the second cavity as shown in FIGS. 13E and 13F. In this particular example, another layer, such as another substrate (not shown) may be formed over the metal structure formed at block 1406. A cavity may then be etched and filed with metal portion Mn+1 as shown in FIGS. 13E and 13F.

In the device of FIG. 13G, conductive regions 1306 and switching regions 1304 are formed in a cavity etched in metal layer Mn. Metal layer Mn+1 is then replaced with a metal via VIAn+1 formed in the cavity etched in metal layer Mn. In an example process, metal layer Mn may be formed by deposition over a substrate 1308. The formed metal layer Mn may then be masked and etched to form the cavity. Conductive regions 1306 and switching regions 1304 may then be formed by a succession of steps of deposition, masking and etching. A final etching step following layer formation (e.g., using deposition) and masking of a second conductive region 1306 provides a cavity to be filled to form VIAn+1 in a subsequent deposition step. In alternative implementations, an electrode material may be deposited on a top layer of CEM to form an electrode layer between the top layer and metal via VIAn+1.

In the example implementations shown in FIGS. 13A through 13G, a switching region 1304 may be formed from one or more layers of intrinsic CEM while the conductive regions 1306 are formed from one or more layers of p-type doped CEM. In an alternative implementation, a switching region 1304 may be formed from one or more layers of p-type doped CEM while conductive regions 1306 are formed from one or more layers of intrinsic CEM.

Figure 15:
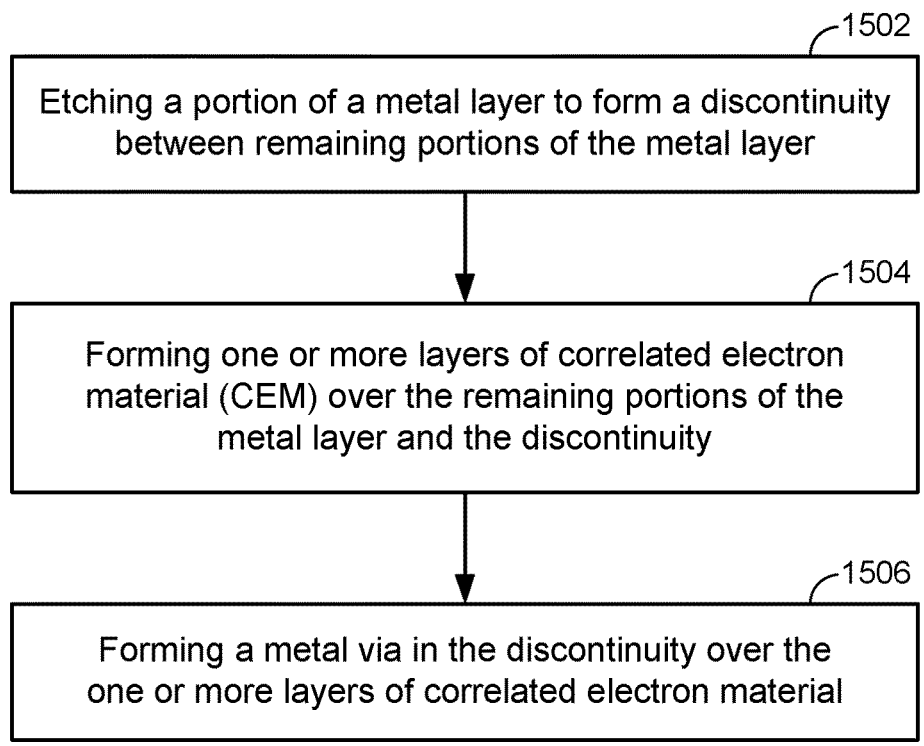

FIG. 15 is an example process to form a device as shown in FIG. 13G according to particular embodiments. At block 1502, a portion of a metal layer formed on a substrate may be etched to form a discontinuity between remaining portions of the metal layer. As shown in FIG. 13G, for example, a portion of metal layer Mn formed on substrate 1308 may be etched to form a discontinuity of remaining portions of Mn supported by substrate 1308. Block 1504 may form multiple layers of CEM as shown in FIG. 13G. In particular example implementations, block 1504 may use techniques to form layers of CEM using any one of several different techniques including, for example and without limitation, deposition processes. Such deposition processes may include, for example, atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, or the like, to form CEM devices, just to provide a few examples. According to an embodiment, repeated steps of formation (e.g., using deposition), masking and etching may be used to form a first conductive layer 1306, switching layer 1304 followed by a second conductive layer 1306. A subsequent etching step following block 1504 may remove at least a portion of CEM formed at block 1504 in the discontinuity formed in block 1502. Block 1506 may then form metal portion VIAn+1 as a via in the discontinuity using deposition, for example.

In particular embodiments, such as those previously described herein, plurality of CEM devices may be formed to bring about integrated circuit devices, which may include, for example, a first correlated electron device having a first CEM and a second correlated electron device having a second correlated electron material, wherein the first and second CEMs may comprise substantially dissimilar impedance characteristics. Also, in an embodiment, a first CEM device and a second CEM device, may be formed within a particular layer of an integrated circuit. Further, in an embodiment, forming the first and second CEM devices within a particular layer of an integrated circuit may include forming the CEM devices at least in part by selective epitaxial deposition. In another embodiment, the first and second CEM devices within a particular layer of the integrated circuit may be formed at least in part by ion implantation, such as to alter impedance characteristics for the first and/or second CEM devices, for example.

Also, in an embodiment, two or more CEM devices may be formed within a particular layer of an integrated circuit at least in part by atomic layer deposition of a CEM. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacently to first and second CEM devices, respectively.

In a further embodiment, one or more of a plurality of CEM devices may be individually positioned within an integrated circuit at one or more intersections of electrically conductive lines of a first metallization layer and electrically conductive lines of a second metallization layer, in an embodiment. One or more access devices may be positioned at a respective one or more of the intersections of the electrically conductive lines of the first metallization layer and the electrically conductive lines of the second metallization layer, wherein the access devices may be paired with respective CEM devices, in an embodiment.

According to an embodiment, a CEM device (e.g., a CES, which may be utilized to form a CEM switch, a CERAM memory device, and/or a variety of other electronic devices comprising one or more correlated electron materials, may be placed into a relatively low-impedance memory state, such as by transitioning from a relatively high-impedance state, for example, via injection of a sufficient quantity of electrons to satisfy a Mott transition criteria. In transitioning a CEM device to a relatively low-impedance state, if enough electrons are injected and the potential across the terminals of a CEM device overcomes a threshold switching potential (e.g., $V_{set}$), injected electrons may begin to screen. Screening may operate to unlocalize double-occupied electrons to collapse the band-splitting potential, thereby bringing about a relatively low-impedance state.

In one or more embodiments, changes in impedance states of CEM devices, such as from a relatively low-impedance state to a substantially dissimilar high-impedance state as discussed above, for example, may be brought about by the "back-donation" of electrons of compounds comprising $Ni_x$: $N_y$ (wherein the subscripts "x" and "y" comprise whole numbers). As the term is used herein, "back-donation" refers to a supplying of one or more electrons to a transition metal, transition metal oxide, or any combination thereof, by an adjacent molecule of the lattice structure, for example, comprising the transition metal, transition metal oxide, or combination thereof. Back-donation permits a transition metal, transition metal oxide, or combination thereof, to maintain an ionization state that is favorable to electrical conduction under the influence of an applied voltage. In one or more embodiments, back-donation in a correlated electron material, for example, may occur responsive to use of a dopant, such as carbonyl (CO), controllably and reversibly "donate" electrons to a conduction band of the transition metal or transition metal oxide, such as nickel, for example, during operation. Back-donation may be reversed, in a nickel oxide material, for example, (e.g., NiO:CO), which may thereby permit the nickel oxide material to switch to exhibiting a high-impedance property during device operation. Thus, in this context, a back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the material.

In some embodiments, by way of back-donation, a CEM device comprising a transition metal or a transition metal oxide, may exhibit low-impedance properties if the transition metal, such as nickel, for example, is placed into an oxidation state of 2+(e.g., $Ni^{2+}$ in a material, such as NiO:CO). Conversely, electron back-donation may be reversed if the transition metal, such as nickel, for example, is placed into an oxidation state of either 1+ or 3+. Accordingly, back-donation may result in "disproportionation," which may comprise substantially simultaneous oxidation and reduction reaction, such as:

$$2Ni^{2+} \rightarrow Ni^{1+} + Ni^{3+} \qquad (7)$$

Such disproportionation, in this instance refers to formation of nickel ions as $Ni^{1+} + Ni^{3+}$ as shown in expression (7), which may bring about, for example, a relatively high-impedance state during operation of a CEM device. In an embodiment, a carbon-containing ligand, such as a carbonyl molecule (CO), may permit sharing of electrons during operation of the CEM device so as to permit the disproportionation reaction and its reversal:

$$Ni^{1+} + Ni^{3+} \rightarrow 2Ni^{2+} \qquad (8)$$

As previously mentioned, reversal of the disproportionation reaction, as shown in expression (8), may permit nickel-based CEM to return to a relatively low-impedance state, in one or more embodiment.

In one or more embodiments, depending on an atomic concentration of carbon in NiO:CO, for example, which may vary from values approximately in the range of an atomic percentage of 0.1% to 10.0%, $V_{reset}$ and $V_{set}$, as shown in FIG. 1A, may vary approximately in the range of 0.1 V to 10.0 V subject to the condition that $V_{set} \geq V_{reset}$. For example, in one possible embodiment, $V_{reset}$ may occur at a voltage approximately in the range of 0.1 V to 1.0 V, and $V_{set}$ may occur at a voltage approximately in the range of 1.0 V to 2.0 V, for example. It should be noted, however, that variations in $V_{set}$ and $V_{reset}$ may occur based, at least in part, on a variety of factors, such as atomic concentration of a back-donating material, such as NiO:CO and other materials present in a CEM device, as well as other process variations, and claimed subject matter is not limited in this respect.

According to an embodiment, layers of CEM may be deposited in embodiments discussed above using any one of several deposition techniques such as, for example, atomic layer deposition to form films comprising nickel oxide materials, such as NiO:CO, to permit electron back-donation during operation of the device in a circuit environment, for example, to give rise to a low-impedance state. Also during operation in a circuit environment, for example, electron back-donation may be reversed so as to give rise to a high-impedance state, for example. In particular embodiments, atomic layer deposition may utilize two or more "precursor" sources to deposit components of, for example, NiO:CO, or other transition metal oxide, transition metal compounds or combinations thereof, onto a conductive substrate. In an embodiment, layers of a CEM device may be deposited utilizing separate molecules, AX and BY, according to expression (9), below:

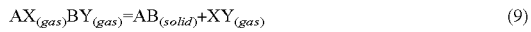

$$AX_{(gas)} BY_{(gas)} = AB_{(solid)} + XY_{(gas)} \qquad (9)$$

Wherein "A" of expression (9) corresponds to a transition metal, transition metal oxide, or any combination thereof. In embodiments, a transition metal oxide may comprise nickel, but may comprise other transition metals and/or transition metal oxides, such as aluminum, cadmium, chromium, cobalt, copper, gold, iron, manganese, mercury, molybdenum, nickel palladium, rhenium, ruthenium, silver, tin, titanium, vanadium.

In particular embodiments, CEM compounds that comprise more than one transition metal oxide may also be utilized, such as yttrium titanate ($YTiO_3$). "X" of expression (9) may comprise a ligand, such as organic ligand, comprising amidinate (AMD), dicyclopentadienyl $(Cp)_2$, diethylcyclopentadienyl $(EtCp)_2$, Bis(2,2,6,6-tetramethylheptane-3,5-dionato) $((thd)_2)$, acetylacetonate (acac), bis(methylcyclopentadienyl) $((CH_3C_5H_4)_2)$, dimethylglyoximate $(dmg)_2$, 2-amino-pent-2-en-4-onato $(apo)_2$, $(dmamb)_2$ where dmamb=1-dimethylamino-2-methyl-2-butanolate, (dmamp)2 where dmamp=1-dimethyl-amino-2-methyl-2-propanolate, Bis(pentamethylcyclopentadienyl) $(C_5(CH_3)_5)_2$ and carbonyl $(CO)_4$. Accordingly, in some embodiments, nickel-based precursors AX may comprise, for example, nickel amidinates (Ni(AMD)) an example of which is $Ni(MeC(NBu)_2)_2$, nickel dicyclopentadienyl $(Ni(Cp)_2)$, nickel diethylcyclopentadienyl (Ni $(EtCp)_2$), Bis(2,2,6,6-tetramethylheptane-3,5-dionato)Ni(II) $(Ni(thd)_2)$, nickel acetylacetonate $(Ni(acac)_2)$, bis(methylcyclopentadienyl)nickel $(Ni(CH_3C_5H_4)_2$, Nickel dimethylglyoximate $(Ni(dmg)_2)$, Nickel 2-amino-pent-2-en-4-onato $(Ni(apo)_2)$, $Ni(dmamb)_2$ where dmamb=1-dimethylamino-2-methyl-2-butanolate, $Ni(dmamp)_2$ where dmamp=1-dimethylamino-2-methyl-2-propanolate, Bis(pentamethylcyclopentadienyl) nickel $(Ni(C_5(CH_3)_5)_2$, and nickel carbonyl $(Ni(CO)_4)$, just to name a few examples.

In expression (9), "BY" may comprise an oxidizer, such as oxygen ($O_2$), ozone ($O_3$), nitric oxide (NO), nitrous oxide ($N_2O$), hydrogen peroxide ($H_2O_2$), water ($H_2O$), just to name a few examples. In embodiments, the AX compound may comprise a transition metal oxide or a transition metal compound. BY may comprise a species chosen such that the reaction shown of expression (9) may form AB, wherein AB represents the CEM formed by the process. In other embodiments, plasma may be used with an oxidizer to form oxygen radicals or other activated species to form one or more layers of CEM. In other embodiments, one or more CEM layers may be deposited using chemical vapor deposition of any type or by sputter deposition or by physical vapor deposition. Therefore, in some embodiments, the X and/or Y may not be required to form AB (such as in the case of sputtering from a target of AB or co sputtering from a target of A and a target of B, or sputtering from a target of A in an ambient environment comprising B. It should be noted that concentrations, such as atomic concentration, of precursor, such as AX and BY may be adjusted so as to bring about a final atomic concentration of carbon, such as in the form of carbonyl, of between approximately 0.1% and 10.0%. However, claimed subject matter is not necessarily limited to the above-identified precursors and/or concentrations. Rather, claimed subject matter is intended to embrace all such precursors utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition or the like, utilized in fabrication of CEM devices.

In particular embodiments, such as embodiments utilizing atomic layer deposition, a substrate may be exposed to precursors in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which atomic layer deposition of NiO:CO is performed, temperature ranges approximately in the range of 20.0° C. and 400.0° C. may be utilized. After exposure to precursor sources, such sources may be purged from the heated chamber, wherein purging may occur over durations approximately in the range of 0.5 seconds to 180.0 seconds. It should be noted, however, that these are merely examples of potentially suitable temperatures and exposure times, and claimed subject matter is not limited in this respect.

In certain embodiments, a single two-precursor cycle utilizing atomic layer deposition may bring about a CEM device layer comprising a thickness approximately in the range of 0.6 Å to 1.5 Å. Accordingly, in an embodiment, to form a CEM device film comprising a thickness of approximately 500 Å utilizing an atomic layer deposition process in which layers comprise a thickness of approximately 0.6 Å, 800-900 two-precursor cycles, such as AX+BY of equation (9), for example, may be utilized. In another embodiment, utilizing an atomic layer deposition process in which layers comprise approximately 1.5 Å, 300 to 350 two-precursor cycles, such as AX+BY, for example, may be utilized. It should be noted that atomic layer deposition may be utilized to form CEM device films having other thicknesses, such as thicknesses approximately in the range of 1.5 nm and 150.0 nm, for example, and claimed subject matter is not limited in this respect.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn. In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method comprising:
    etching a portion of a metal layer to form a discontinuity between remaining portions of the metal layer;
    forming one or more layers of correlated electron material (CEM) over the remaining portions of the metal layer and the discontinuity; and
    forming a metal via in the discontinuity over the one or more layers of CEM.

2. The method of claim 1, and further comprising depositing one or more layers of an electrode material over the remaining portions of the metal layers prior to the forming of the one or more layers of the CEM.

3. The method of claim 2, wherein the electrode material comprises titanium nitride, platinum, titanium, copper, aluminum, cobalt, nickel, tungsten, tungsten nitride, cobalt silicide, ruthenium oxide, chromium, gold, palladium, indium tin oxide, tantalum, silver or iridium, or any combination thereof.

4. The method of claim 1, and further comprising depositing one or more layers of an electrode material over the remaining portions of the metal layers prior to the forming of the one or more layers of the CEM.

5. The method of claim 1, wherein forming the one or more layers of correlated electron material (CEM) over the remaining portions of the metal layer and the discontinuity further comprises depositing the one or more layers.

6. The method of claim 1, wherein forming the one or more layers of CEM over the remaining portions of the metal layer and the discontinuity comprises forming at least one layer of CEM to provide at least one continuous switching region and forming at least two of the layers of CEM to provide at least two conductive regions.

7. The method of claim 1, wherein forming the one or more layers of CEM over the remaining portions of the metal layer and the discontinuity further comprises forming the one or more layers of CEM to comprise two or more discontinuous switching regions and at least two conductive regions.

8. The method of claim 7, and further comprising forming the two or more discontinuous switching regions to comprise intrinsic CEM and forming the two or more conductive regions to comprise p-type doped CEM.

9. The method of claim 7, and further comprising forming the two or more discontinuous switching regions to comprise p-type doped CEM and forming the two or more conductive regions to comprise intrinsic CEM.

10. A device comprising:
    a substrate;
    metal layer formed on the substrate, the metal layer to comprise at least one discontinuity;
    one or more layers of correlated electron material (CEM) to be formed in the discontinuity; and
    a metal via to be formed in the discontinuity.

11. The device of claim 10, wherein the one or more layers of CEM to comprise at least one layer of CEM to form a switching region, and two or more layers of CEM to form two or more conductive regions.

12. The device of claim 10, wherein the switching region to comprise intrinsic CEM and the two or more conductive regions to comprise p-type doped CEM.

13. The device of claim 11, wherein the switching region to comprise p-type doped CEM and the two or more conductive regions to comprise intrinsic CEM.

14. The device of claim 10, and further comprising one or more layers of electrode material formed between the metal via and the one or more layers of CEM.

15. The device of claim 10, and further comprising one or more layers of an electrode material disposed between at least a portion of the one or more layers of CEM and the substrate.

16. The device of claim 15, wherein the electrode material to comprise titanium nitride, platinum, titanium, copper, aluminum, cobalt, nickel, tungsten, tungsten nitride, cobalt silicide, ruthenium oxide, chromium, gold, palladium, indium tin oxide, tantalum, silver or iridium, or any combination thereof.

17. The device of claim 10, wherein the switching region to comprise a continuous switching region and at least two of the one or more layers to comprise at least two conductive regions.

18. The device of claim 10, wherein the one or more layers of CEM to comprise two or more discontinuous switching regions, and at least two of the one or more layers to comprise at least two conductive regions.

19. The device of claim 18, wherein the two or more discontinuous switching regions to comprise intrinsic CEM and the two or more conductive regions to comprise p-type doped CEM.

20. The device of claim 18, wherein the two or more discontinuous switching regions comprise p-type doped CEM and the two or more conductive regions to comprise intrinsic CEM.

* * * * *